United States Patent
Sato

(10) Patent No.: US 9,050,683 B2
(45) Date of Patent: Jun. 9, 2015

(54) LASER DICING METHOD

(71) Applicant: Toshiba Kikai Kabushiki Kaisha, Tokyo (JP)

(72) Inventor: Shoichi Sato, Shizuoka (JP)

(73) Assignee: Toshiba Kikai Kabushiki Kaisha, Chiyoda-ku, Tokyo (JP)

( * ) Notice: Subject to any disclaimer, the term of this patent is extended or adjusted under 35 U.S.C. 154(b) by 11 days.

(21) Appl. No.: 13/929,472

(22) Filed: Jun. 27, 2013

(65) Prior Publication Data

US 2014/0004639 A1 Jan. 2, 2014

(30) Foreign Application Priority Data

Jun. 29, 2012 (JP) ................... 2012-147728

(51) Int. Cl.
*H01L 21/00* (2006.01)
*B23K 26/00* (2014.01)
*B23K 26/06* (2014.01)
(Continued)

(52) U.S. Cl.
CPC ......... *B23K 26/0057* (2013.01); *B23K 26/0039* (2013.01); *B23K 26/0051* (2013.01); *B23K 26/0087* (2013.01); *B23K 26/063* (2013.01); *B23K 26/0861* (2013.01); *B23K 26/367* (2013.01); *B23K 26/4005* (2013.01); *B23K 26/4075* (2013.01); *B23K 26/409* (2013.01); *B23K 26/0009* (2013.01);
(Continued)

(58) Field of Classification Search
CPC ............. B23K 26/0087; B23K 26/367; B23K 26/4005; B23K 26/421; H01L 21/78; H01L 21/2026; H01L 21/268; H01L 21/02675; H01L 21/02686; H01L 27/1285

USPC ............... 219/121.69, 121.61, 121.68, 121.6, 219/121.78; 257/E21.599, E21.602; 438/33, 113, 462, 463, 458, 460, 68, 438/940, 487

See application file for complete search history.

(56) References Cited

U.S. PATENT DOCUMENTS

| 3,985,597 A | 10/1976 | Zielinski |
| 4,519,872 A | 5/1985 | Anderson |

(Continued)

FOREIGN PATENT DOCUMENTS

| CN | 1347176 | 5/2002 |
| JP | 04-135083 | 5/1992 |

(Continued)

OTHER PUBLICATIONS

Japanese Office Action issued in JP 2012-192985 on Jan. 7, 2014.
(Continued)

*Primary Examiner* — Bac Au
(74) *Attorney, Agent, or Firm* — DLA Piper LLP (US)

(57) ABSTRACT

A laser dicing method of a work piece on a surface of which a metal film is provided, includes: a first metal film removing of irradiating a pulse laser beam defocused from the metal film, along a first line, and removing the metal film; a second metal film removing of irradiating the pulse laser beam defocused from the metal film, along a second line orthogonal to the first line, and removing the metal film; and a crack forming of irradiating the pulse laser beam in an area from which the metal film of the work piece is removed, and forming the crack in the work piece, and, in an area in which the first line and the second line cross, irradiation of the pulse laser beam is interrupted in the first metal film removing or the second metal film removing.

10 Claims, 26 Drawing Sheets

(51) Int. Cl.
- *B23K 26/08* (2014.01)
- *B23K 26/36* (2014.01)
- *B23K 26/40* (2014.01)
- *C03C 23/00* (2006.01)
- *H01L 33/00* (2010.01)

(52) U.S. Cl.
CPC ........ *B23K 26/0042* (2013.01); *C03C 23/0025* (2013.01); *H01L 33/0095* (2013.01)

(56) References Cited

U.S. PATENT DOCUMENTS

| | | | |
|---|---|---|---|
| 4,871,896 | A | 10/1989 | Kempter et al. |
| 4,894,115 | A | 1/1990 | Eichelberger |
| 5,000,811 | A | 3/1991 | Campanelli |
| 5,227,607 | A | 7/1993 | Ishiyama |
| 5,742,634 | A | 4/1998 | Rieger et al. |
| 6,172,325 | B1 | 1/2001 | Baird |
| 7,205,501 | B2 | 4/2007 | Arai et al. |
| 7,405,137 | B2 | 7/2008 | Terayama |
| 7,754,582 | B2 * | 7/2010 | Morikazu et al. ............. 438/460 |
| 7,982,160 | B2 | 7/2011 | Baird |
| 8,178,818 | B2 | 5/2012 | Baird |
| 8,253,066 | B2 | 8/2012 | Gu |
| 8,269,137 | B2 | 9/2012 | Ehrmann |
| 2002/0115235 | A1 | 8/2002 | Sawada |
| 2002/0149136 | A1 | 10/2002 | Baird |
| 2004/0002199 | A1 | 1/2004 | Fukuyo |
| 2004/0134894 | A1 | 7/2004 | Gu |
| 2005/0092720 | A1 | 5/2005 | Gu et al. |
| 2005/0181581 | A1 | 8/2005 | Fukuyo |
| 2006/0086704 | A1 | 4/2006 | Nagai et al. |
| 2006/0091126 | A1 | 5/2006 | Baird et al. |
| 2006/0092990 | A1 | 5/2006 | Koga et al. |
| 2006/0102601 | A1 | 5/2006 | Shirk et al. |
| 2006/0119691 | A1 | 6/2006 | Shigematsu |
| 2006/0169677 | A1 | 8/2006 | Deshi |
| 2006/0191884 | A1 | 8/2006 | Johnson et al. |
| 2006/0223234 | A1 | 10/2006 | Terayama |
| 2007/0248136 | A1 | 10/2007 | Leonardo |
| 2008/0003708 | A1 | 1/2008 | Hoshino |
| 2008/0013163 | A1 | 1/2008 | Leonardo |
| 2008/0029491 | A1 | 2/2008 | Johnson |
| 2008/0057599 | A1 | 3/2008 | Kobashi |
| 2008/0179304 | A1 | 7/2008 | Osako |
| 2008/0204748 | A1 | 8/2008 | Nomaru |
| 2009/0004828 | A1 | 1/2009 | Kobayashi |
| 2009/0032510 | A1 | 2/2009 | Ando |
| 2009/0032511 | A1 | 2/2009 | Adams et al. |
| 2009/0081851 | A1 | 3/2009 | Sakamoto |
| 2009/0095722 | A1 | 4/2009 | Ehrmann |
| 2009/0153868 | A1 | 6/2009 | Sawabe |
| 2009/0184096 | A1 | 7/2009 | Karasaki |
| 2009/0197351 | A1 | 8/2009 | Morikazu |
| 2009/0242522 | A1 | 10/2009 | Baird |
| 2009/0242531 | A1 | 10/2009 | Baird |
| 2010/0099239 | A1 | 4/2010 | Dunne |
| 2010/0248451 | A1 * | 9/2010 | Pirogovsky et al. .......... 438/463 |
| 2011/0037149 | A1 | 2/2011 | Fukuyo |
| 2011/0095006 | A1 | 4/2011 | Hayashi |
| 2011/0240619 | A1 | 10/2011 | Hayashi |
| 2011/0318877 | A1 | 12/2011 | Akiyama |
| 2013/0026145 | A1 * | 1/2013 | Ide et al. .................. 219/121.72 |

FOREIGN PATENT DOCUMENTS

| | | |
|---|---|---|
| JP | 05-177370 | 7/1993 |
| JP | 10-044139 | 2/1998 |
| JP | 10-305384 | 11/1998 |
| JP | 11-224866 | 8/1999 |
| JP | 2002-103066 | 4/2002 |
| JP | 2002-192367 | 7/2002 |
| JP | 2002-192370 | 7/2002 |
| JP | 2002-273585 | 9/2002 |
| JP | 3408805 | 3/2003 |
| JP | 2003-100653 | 4/2003 |
| JP | 2004-528991 | 9/2004 |
| JP | 2004-351466 | 12/2004 |
| JP | 2005-088068 | 4/2005 |
| JP | 2006-123228 | 5/2006 |
| JP | 2006-159254 | 6/2006 |
| JP | 2006-231411 | 9/2006 |
| JP | 2008-209299 | 9/2006 |
| JP | 3867107 | 10/2006 |
| JP | 2007-048995 | 2/2007 |
| JP | 2007-118011 | 5/2007 |
| JP | 2008-006492 | 1/2008 |
| JP | 2008-098465 | 4/2008 |
| JP | 2009-010105 | 1/2009 |
| JP | 2009-123875 | 6/2009 |
| JP | 2009-145292 | 7/2009 |
| JP | 2009-160625 | 7/2009 |
| JP | 2009-188203 | 8/2009 |
| JP | 2009-200140 | 9/2009 |
| JP | 2009-214182 | 9/2009 |
| JP | 2009-534850 | 9/2009 |
| JP | 2009-226457 | 10/2009 |
| JP | 2010-000542 | 1/2010 |
| JP | 2010-228007 | 10/2010 |
| JP | 2011-240383 | 1/2011 |
| JP | 2011-091322 | 5/2011 |
| JP | 2012-006039 | 1/2012 |
| JP | 2012-006040 | 1/2012 |
| JP | 2012-076093 | 4/2012 |
| JP | 2012-028734 | 9/2012 |
| JP | 2013-048244 | 3/2013 |
| JP | 2013-091074 | 5/2013 |
| KR | 10-0339057 | 5/2002 |
| KR | 10-0444919 | 8/2004 |
| KR | 10-2006-0042968 | 5/2006 |
| KR | 1020100039690 | 4/2010 |
| KR | 10-2011-0046315 | 5/2011 |
| TW | 200621409 | 7/2006 |
| TW | I260051 | 8/2006 |
| TW | 200944321 | 1/2009 |
| TW | 200924891 | 6/2009 |
| WO | WO 98/22995 | 5/1998 |
| WO | WO 2008/008678 | 1/2008 |
| WO | WO 2008/091447 | 7/2008 |
| WO | WO 2009/039184 | 3/2009 |
| WO | WO 2010/139841 | 12/2010 |

OTHER PUBLICATIONS

English Language Japanese Office Action issued in JP 2012-192985 on Jan. 7, 2014.
English Language Abstract and Translation of JP 2009-10105 published on Jan. 15, 2009.
English Language Abstract and Translation of JP 2010-000542 published on Jan. 7, 2010.
English Language Abstract and Translation of JP 2006-123228 published on May 18, 2006.
Korean Office Action issued in KR 10-2012-0081623 dated Feb. 11, 2014.
English Language Translation of Korean Office Action issued in KR 10-2012-0081623 dated Feb. 11, 2014.
Japanese Office Action issued in JP 2009-245573 on Mar. 4, 2014.
English Language Translation of Japanese Office Action issued in JP 2009-245573 on Mar. 4, 2014.
English Language Abstract and Translation of JP 2009-534850 published on Sep. 24, 2014.
English Language Abstract and Translation of JP 2009-188203 published Aug. 20, 2009.
English Language Abstract and Translation of JP 2005-088068 published on Apr. 7, 2005.
English Language Abstract and Translation of JP 2004-351466 published on Dec. 16, 2004.
English Language Abstract and Translation of JP 2004-528991 published on Sep. 24, 2004.
English Language Abstract and Translation of JP 10-305384 published on Nov. 17, 1998.

(56) References Cited

OTHER PUBLICATIONS

English Language Abstract and Translation of JP 2009-226457 published on Oct. 8, 2009.
English Language Abstract and Translation of JP 2008-098465 published on Apr. 24, 2008.
English Language Abstract and Translation of JP 2008-006492 published Jan. 17, 2008.
Japanese Office Action issued in JP 2009-245573 on Oct. 1, 2013.
English Language Translation of Japanese Office Action issued in JP 2009-245573 on Oct. 1, 2013.
English Language Abstract and Translation of JP 2009-145292 published Jul. 2, 2009.
English Language Abstract and Translation of JP 2007-118011 published May 17, 2007.
English Language Abstract and Translation of JP 2006-159254 published Jun. 22, 2006.
English Language Abstract and Translation of JP 2008-209299 published Sep. 11, 2008.
English Language Abstract and Translation of JP 2002-273585 published Sep. 25, 2002.
English Abstract of JP 2006-231411 published Sep. 7, 2006 corresponds to JP 3867107.
English Abstract of JP 2002-192370 published Jul. 10, 2002 corresponds to JP 3408805.
Midorikawa, Katsumi; Recent Progress of Femtosecond Lasers and Their Applications to Materials Processing; Proceedings of Laser Materials Processing Conference; Dec. 1998; pp. 29-38; vol. 45; Japan.
English Translation of JP Patent 3867107 published Oct. 13, 2006.
English Translation of JP Patent 3408805 published Mar. 14, 2003.
English Language Abstract of JP 2009-200140 published Sep. 3, 2009.
English Language Translation of JP 2009-200140 published Sep. 3, 2009.
English Translation of JP 2002-192370 published Jul. 10, 2002 corresponds to JP 3408805.
English Language Translation of 2006-231411 published Sep. 7, 2006 which corresponds to JP 3867107.
U.S. Appl. No. 13/008,382.
U.S. Appl. No. 13/159,192.
U.S. Appl. No. 12/911,277.
Korean Office Action issued in KR 10-2010-104013 on Jun. 14, 2012.
English Language Translation of Korean Office Action issued in KR-10-2010-104013 on Jun. 14, 2012.
English Language Abstract of JP 2002-103066 published Apr. 9, 2002.
English Language Translation of JP 2002-103066 published Apr. 9, 2002.
English Language Abstract of JP 4-135083 published May 8, 1992.
English Language Abstract of JP 11-224866 published Aug. 17, 1999.
English Language Translation of JP 11-224866 published Aug. 17, 1999.
English Language Abstract of JP 2003-100653 published Apr. 4, 2003.
English Language Translation of JP 2003-100653 published Apr. 4, 2003.
Korean Office Action issued in KR 10-2011-60952 on Aug. 2, 2012.
English Language Translation of Korean Office Action issued in KR 10-2011-60952 on Aug. 2, 2012.
Image File Wrapper of related U.S. Appl. No. 13/556,618 2013 electronically captured on Dec. 4, 2013.
Related U.S. Appl. No. 13/556,668 2013.
Korean Office Action issued in KR 10-2011-0005848 Sep. 1, 2012.
English Language Translation of Korean Office Action issued in KR 10-2011-0005848 Sep. 1, 2012.
English Language Abstract of JP 05-177370 published Jul. 20, 1993.
English Language Translation of JP 05-177370 published Jul. 20, 1993.
English Language Abstract of KR 20000048927 published Jul. 20, 2000 (later published as KR10-0339057 May 31, 2002.
Japanese Office Action issued in JP 2012-074937 dated Jun. 29, 2012.
English Language Translation of Japanese Office Action issued in JP 2012-074937 dated Jun. 29, 2012.
English Language Abstract of JP 2011-091322 published May 6, 2011.
English Language Translation of JP 2011-091322 published May 6, 2011.
English Language Abstract of JP 2010-228007 published Oct. 14, 2010.
Chinese Office Action issued in CN 201110023878.3 on Mar. 20, 2013.
English Language Translation of Chinese Office Action issued in CN 201110023878.3 on Mar. 20, 2013.
Taiwanese Office Action issued in TW 100121039 on Mar. 29, 2013.
English Language Translation of Taiwanese Office Action issued in TW 100121039 on Mar. 29, 2013.
English Language Abstract of JP 10-044139 published Feb. 17, 1998.
English Language Translation of JP 10-044139 published Feb. 17, 1998.
English Language Abstract of KR 1020100039690 published Apr. 16, 2010.
English Language Abstract of JP 2002-192367 published Jul. 10, 2002.
English Language Translation of JP 2002-192367 published Jul. 10, 2002.
Japanese Office Action issued in JP 2012-147728 on Feb. 19, 2013.
English Language Translation of Japanese Office Action issued in JP 2012-147728 on Feb. 19, 2013.
English Language Abstract of JP 2012-076093 published Apr. 19, 2012.
English Language Translation of JP 2012-076093 published Apr. 19, 2012.
English Language Abstract of JP 2007-048995 published Feb. 22, 2007.
English Language Translation of JP 2007-048995 published Feb. 22, 2007.
English Language Abstract of JP 2012-028734 published Feb. 9, 2012.
English Language Translation of JP 2012-028734 published Feb. 9, 2012.
U.S. Appl. No. 13/936,022.
Taiwanese Office Action issued in TW100101957 dated Jun. 28, 2013.
English Language Translation of Taiwanese Office Action issued in TW100101957 dated Jun. 28, 2013.
English Language Abstract of TW504879 (corresponding to CN 1347176) published Oct. 1, 2002.
English Language Abstract of JP 2011-240383 published Dec. 1, 2011.
English Language Translation of JP 2011-240383 published Dec. 1, 2011.
English Language Abstract of JP 2012-006040 published Dec. 1, 2012.
English Language Translation of JP 2012-006040 published Dec. 1, 2012.
English Language Abstract of JP 2012-006039 published Dec. 1, 2012.
English Language Translation of JP 2012-006039 published Dec. 1, 2012.
English Language Abstract of JP 2013-091074 published May 16, 2013.
English Language Translation of JP 2013-091074 published May 16, 2013.
English Language Abstract of JP 2013-048244 published Jul. 3, 2013.
English Language Translation of JP 2013-048244 published Jul. 3, 2013.
Japanese Office Action issued in JP 2012-147728 on Jul. 16, 2013.
English Language Translation of Japanese Office Action issued in JP 2012-147728 on Jul. 16, 2013.

(56) References Cited

OTHER PUBLICATIONS

Japanese Office Action issued in JP 2010-011348 on Aug. 20, 2013.
English Language Translation of Japanese Office Action issued in JP 2010-011348 on Aug. 20, 2013.
English Language Abstract and Translation of JP 10-305384 published Nov. 17, 1998.
English Language Abstract and Translation of JP2009-214182 published Sep. 24, 2009.
Taiwanese Office Action issued in TW 099136123 on Aug. 20, 2013.
English Language Translation of Taiwan Office Action issued in TW 099136123 on Aug. 20, 2013.
English Language Abstract of JP 2009-160625 published Jul. 23, 2009.
English Language Translation of JP 2009-160625 published Jul. 23, 2009.
English Language Abstract of TW 2006/21409 published as TW 200621409 published on Jul. 1, 2011 (corresponds to US 2009/0081851).
English Language Abstract of JP 2006-122982 published May 18, 2006 (corresponds to US 2009/0092990).
English Language Translation of JP 2006-122982 published May 18, 2006 (corresponds to US 2006/0092990).
English Language Abstract of TW 200924891 published Jun. 16, 2009 (corresponding to WO 2009/039184).
English Language Abstract of JP-2009-123875 published Jun. 4, 2009.
English Language Translation of JP-2009-123875 published Jun. 4, 2009.
Korean Office Action issued in KR 10-2012-81839 on Aug. 23, 2013.
English Language Translation of Korean Office Action issued in KR 10-2012-81839 on Aug. 23, 2013.
Korean Office Action issued in KR 10-2012-81534 on Aug. 22, 2013.
English Language Translation of Korean Office Action issued in KR 10-2012-81534 on Aug. 22, 2013.
Korean Office Action issued in KR 10-2012-0081623 on Aug. 23, 2013.
English Language Translation of Korean Office Action issued in KR 10-2012-0081623 on Aug. 23, 2013.
English Language Abstract of KR 10-2011-0046315 published May 4, 2011.
Korean Office Action issued in KR 10-2013-0075213 on Jul. 11, 2014 with an English Language Translation.
Related U.S. Appl. No. 13/008,382.
Related U.S. Appl. No. 13/159,192.
Related U.S. Appl. No. 12/911,277.
Related U.S. Appl. No. 13/556,641.
Related U.S. Appl. No. 13/556,618.
Related U.S. Appl. No. 13/556,668.
Related U.S. Appl. No. 14/466,755.

* cited by examiner

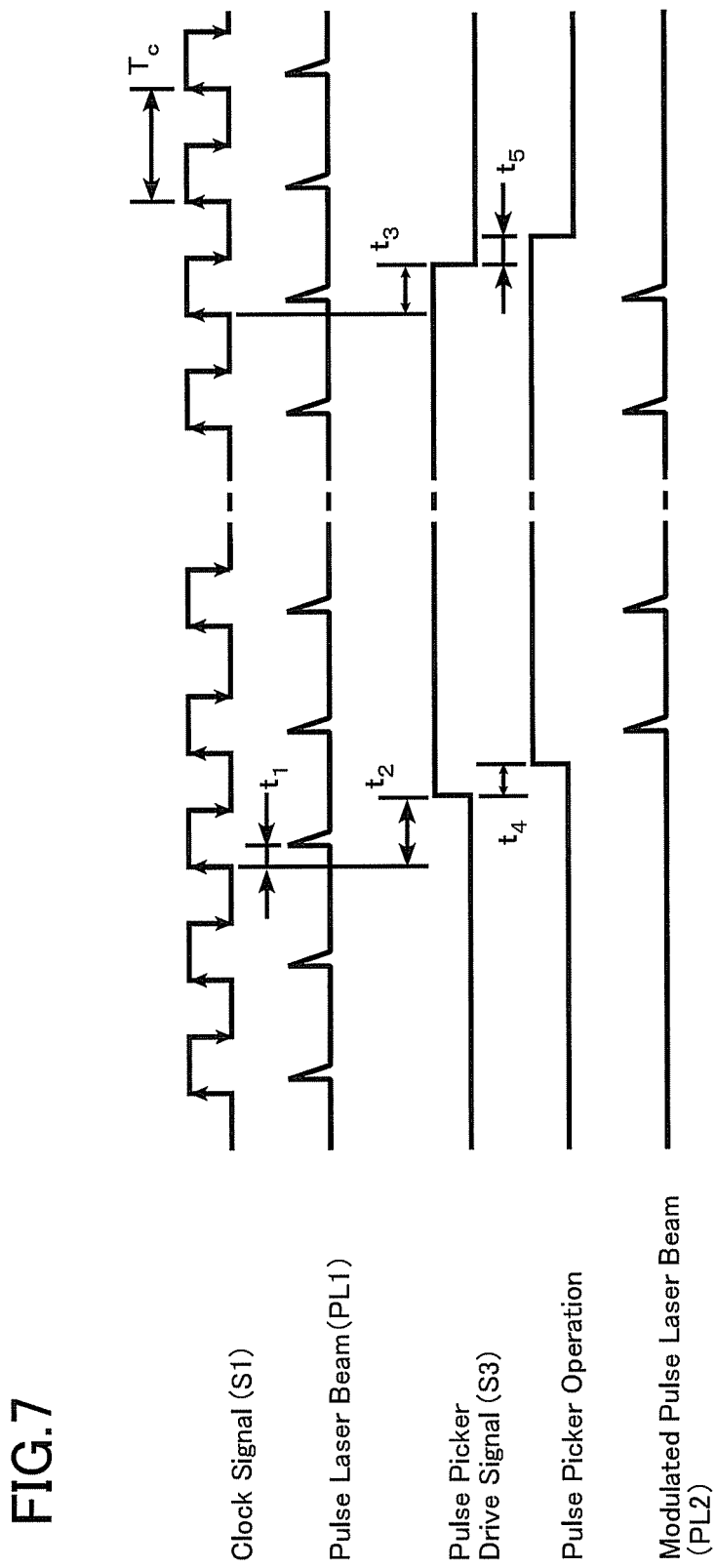

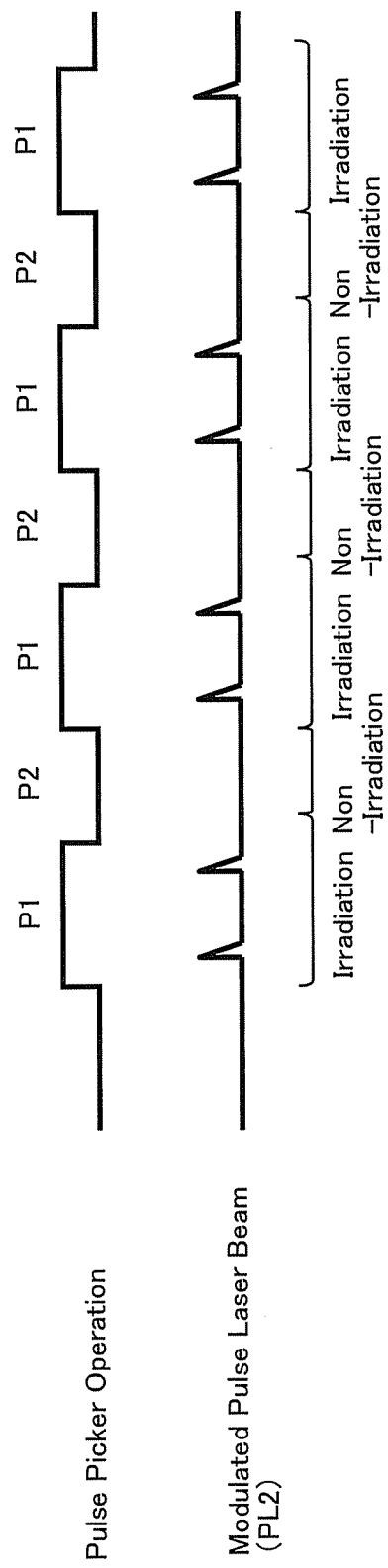

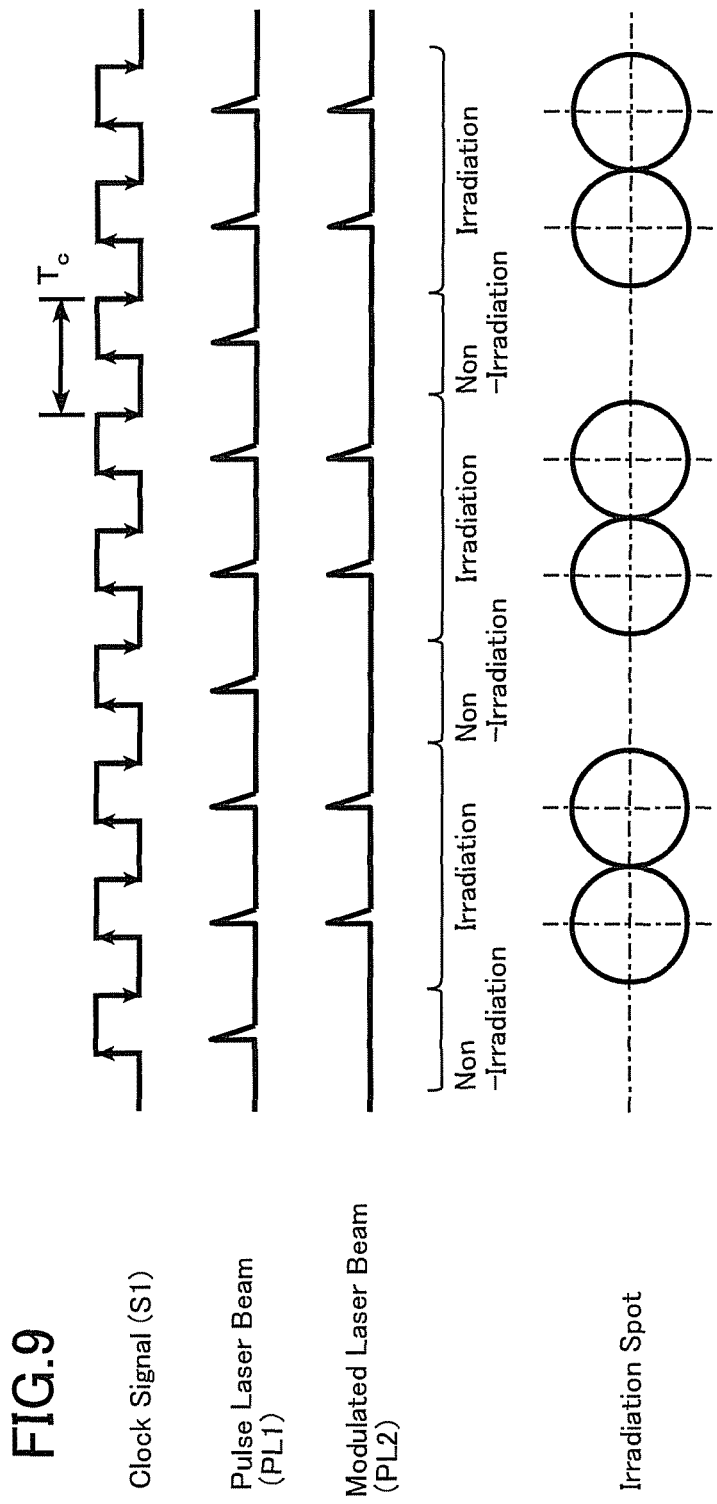

FIG.10A
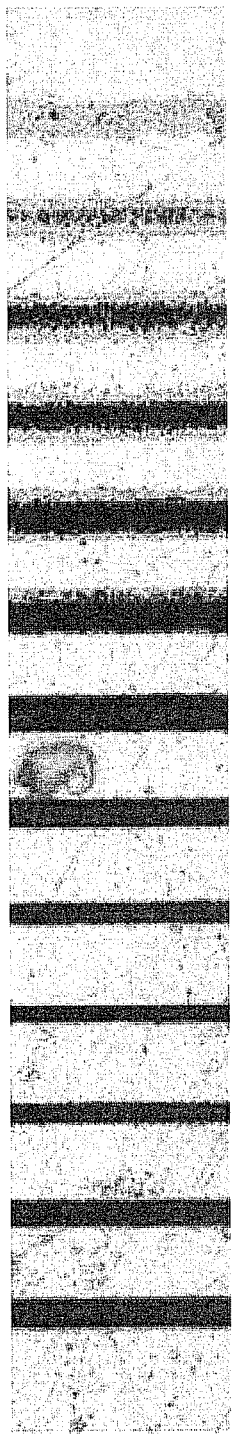
FIG.10B
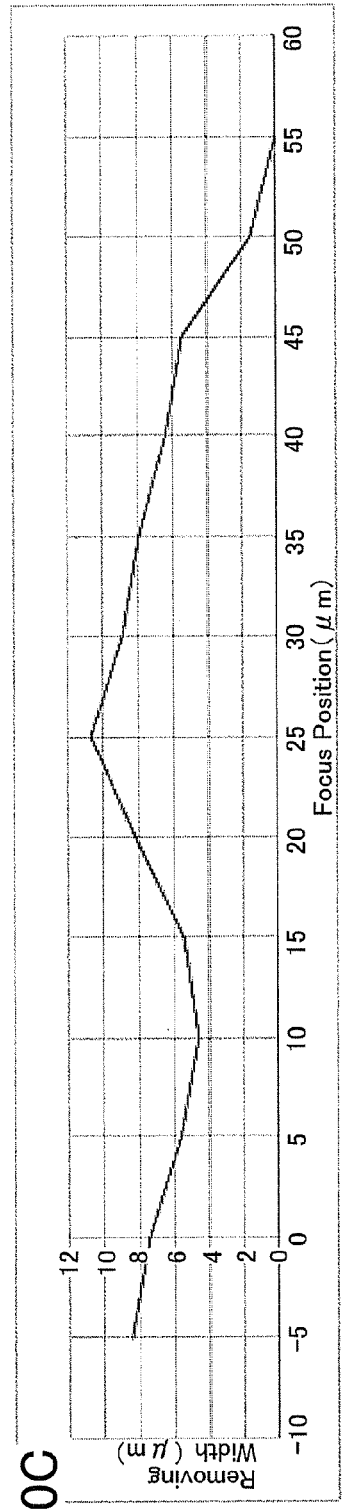
FIG.10C

FIG.16A IN-PHASE
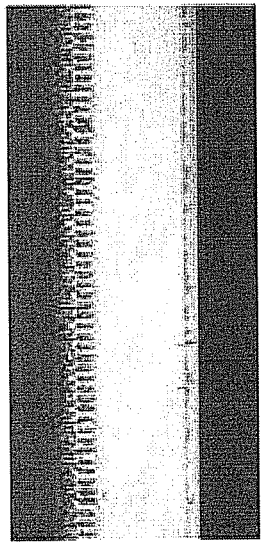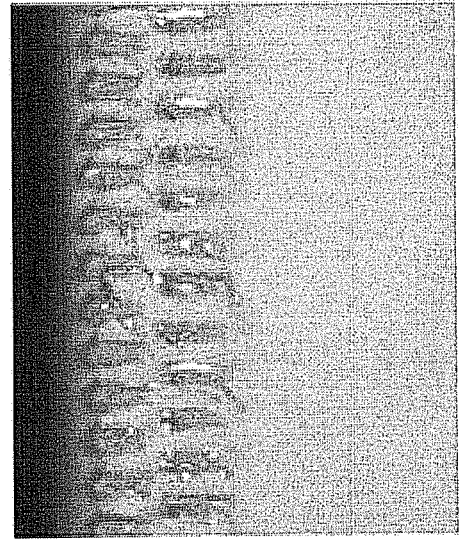
FIG.16B OUT-OF-PHASE
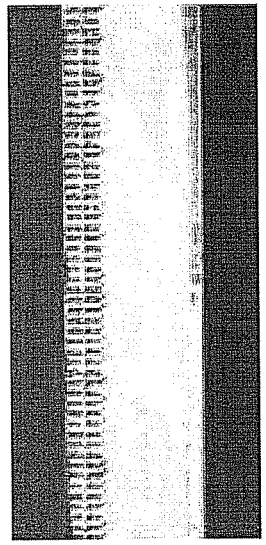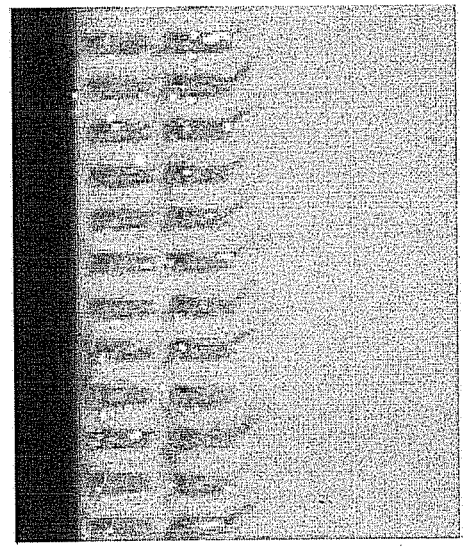

FIG.19A    FIG.19B    FIG.19C    FIG.19D    FIG.19E
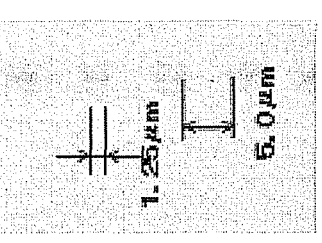 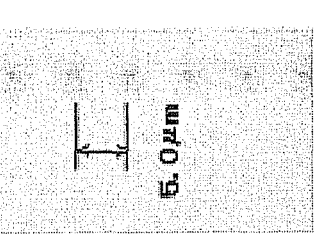 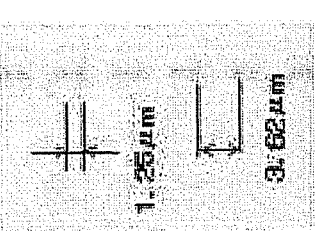 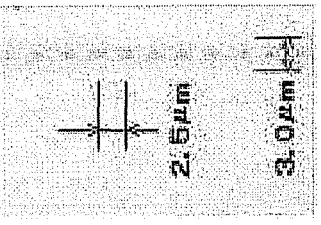 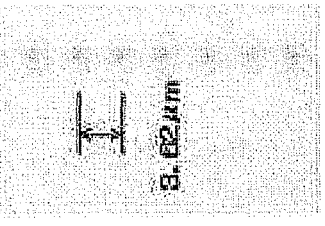
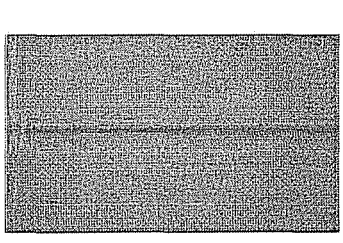 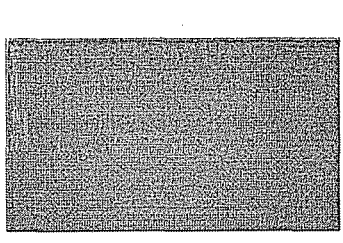 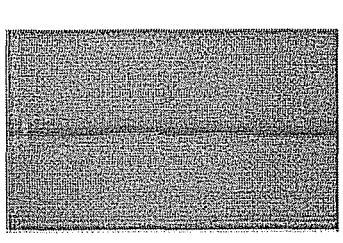 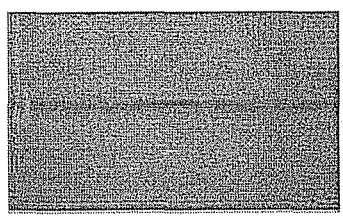 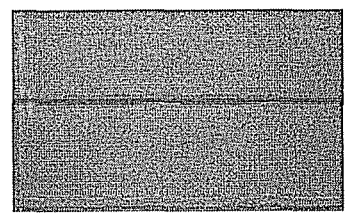

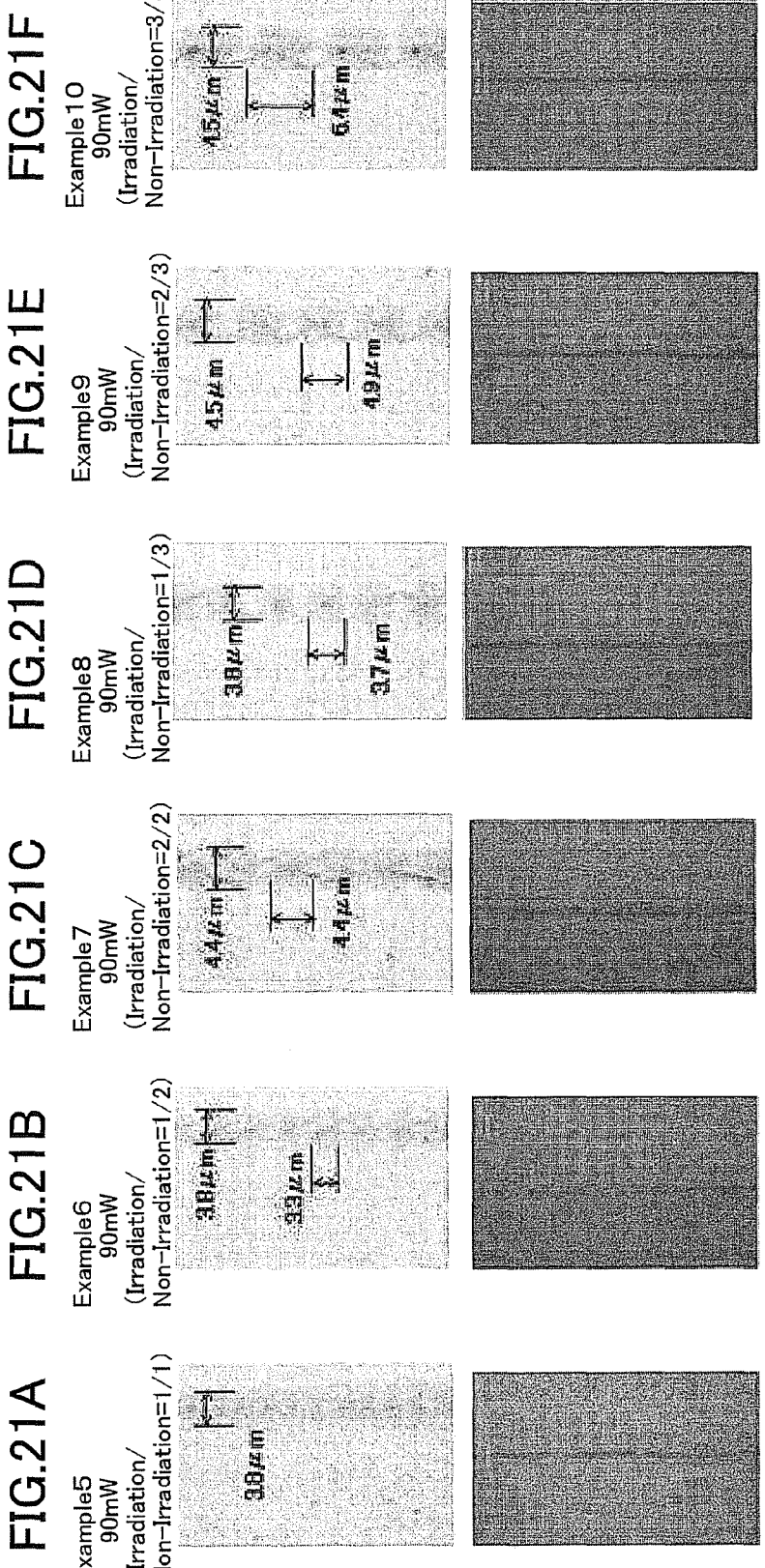

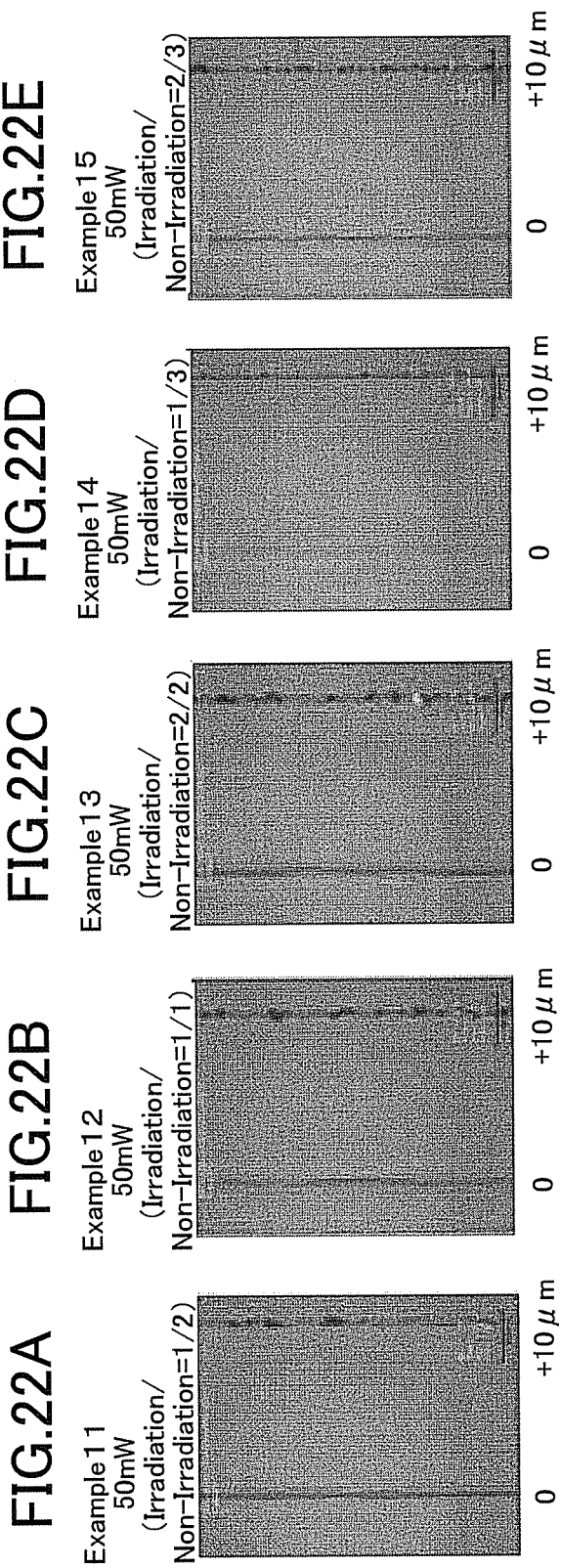

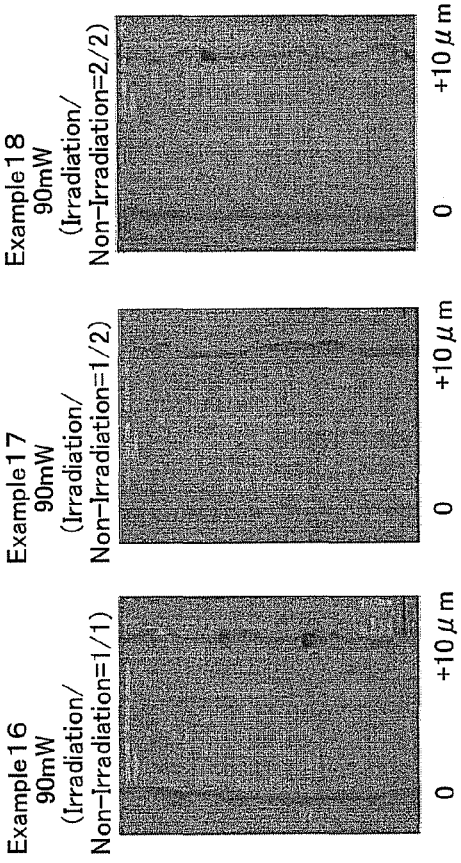
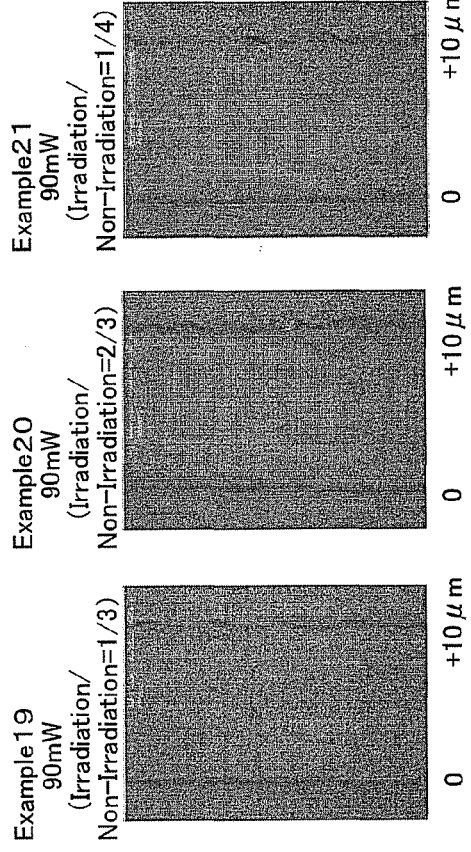
FIG.23A Example16 90mW (Irradiation/Non-Irradiation=1/1)
FIG.23B Example17 90mW (Irradiation/Non-Irradiation=1/2)
FIG.23C Example18 90mW (Irradiation/Non-Irradiation=2/2)
FIG.23D Example19 90mW (Irradiation/Non-Irradiation=1/3)
FIG.23E Example20 90mW (Irradiation/Non-Irradiation=2/3)
FIG.23F Example21 90mW (Irradiation/Non-Irradiation=1/4)

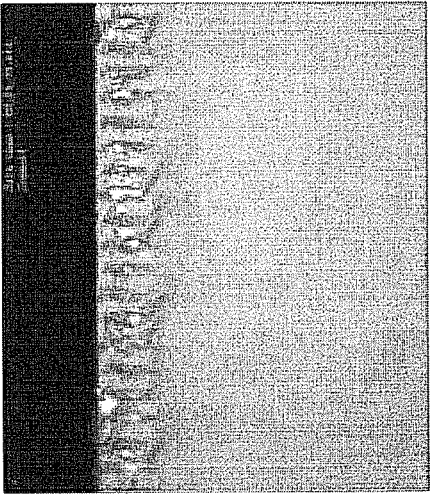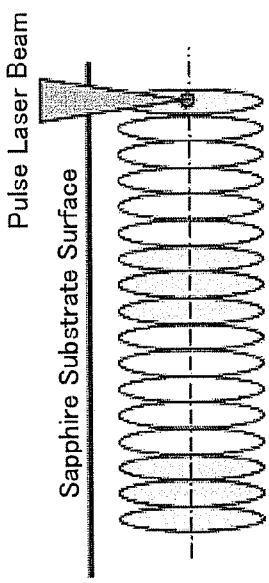
FIG.24C
Example24
(Irradiation/Non-Irradiation=3/5)
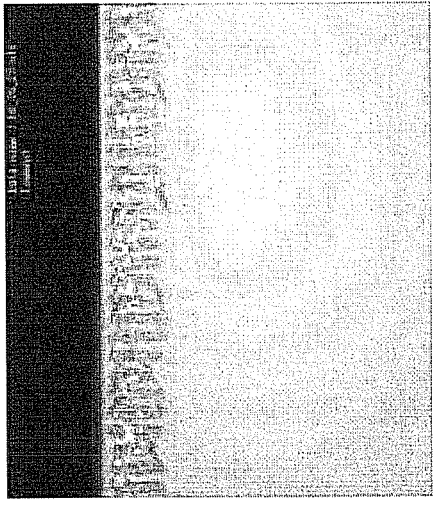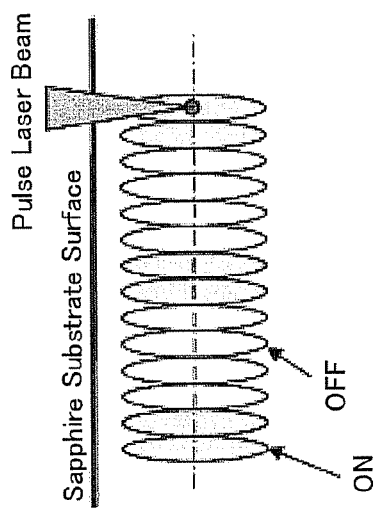
FIG.24B
Example23
(Irradiation/Non-Irradiation=2/4)
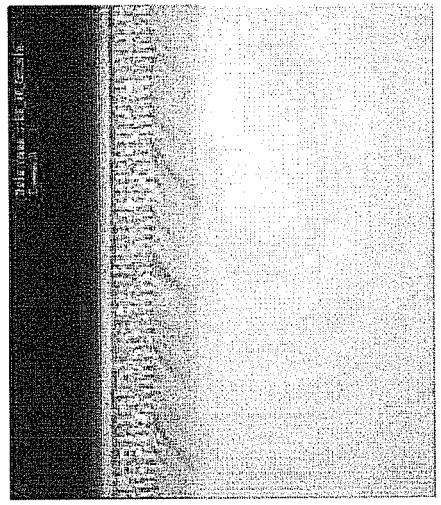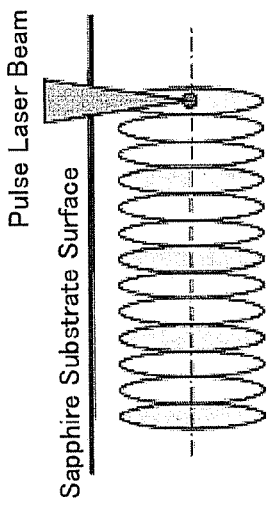
FIG.24A
Example22
(Irradiation/Non-Irradiation=1/2)

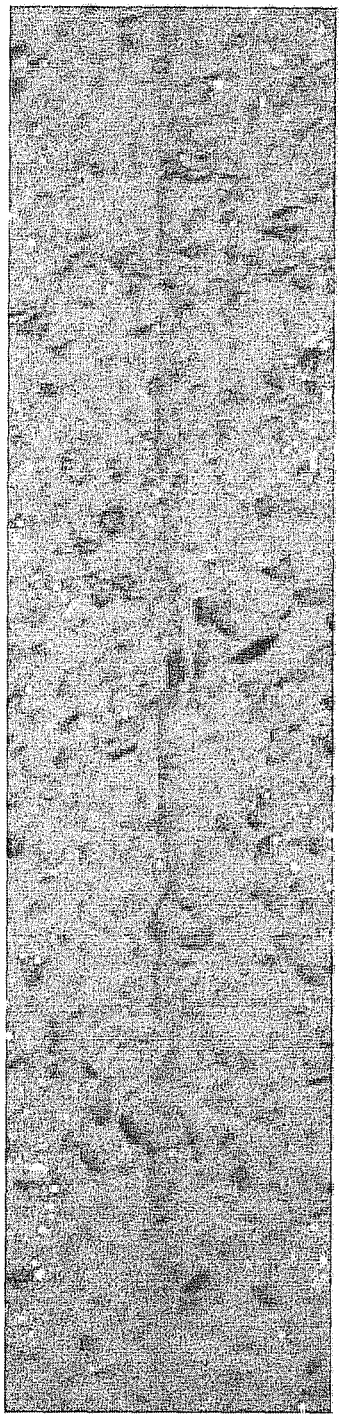
FIG.25A Example 25
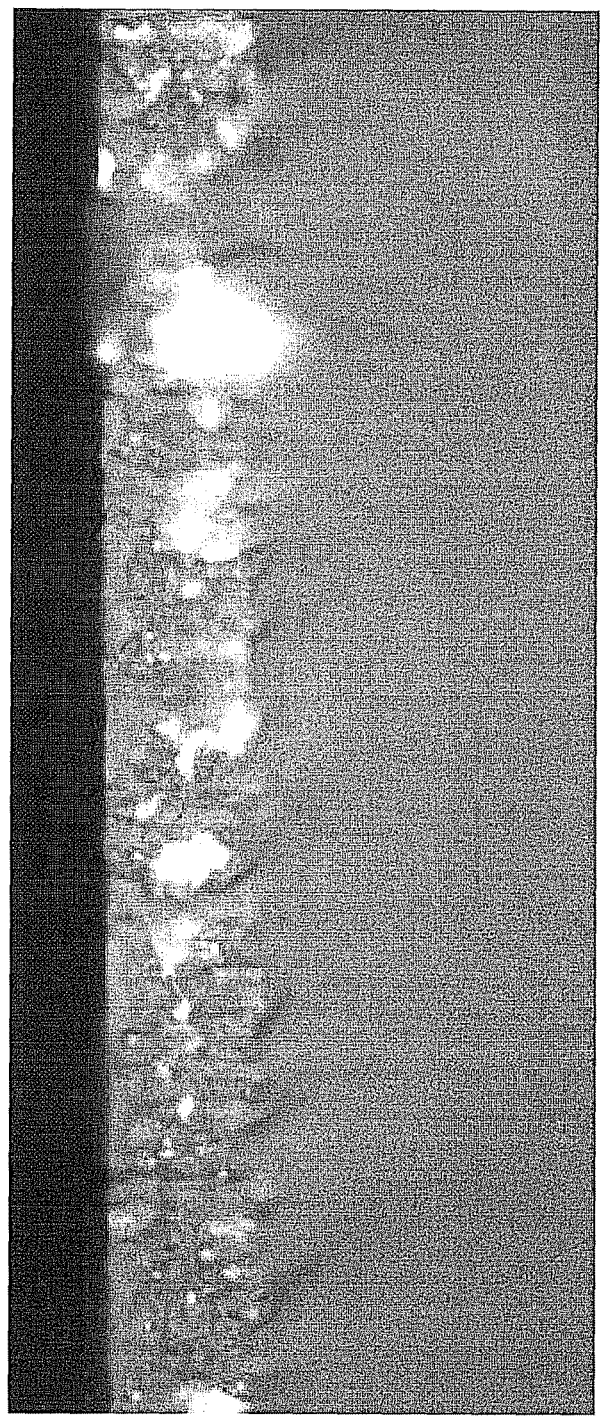
FIG.25B Example 25

LASER DICING METHOD

CROSS-REFERENCE TO RELATED APPLICATION

This application is based on and claims priority of Japanese Patent Application (JPA) No. 2012-147728, filed on Jun. 29, 2012, the entire contents of which are incorporated herein by reference.

FIELD OF THE INVENTION

Embodiments described herein relate generally to a laser dicing method using a pulse laser beam.

BACKGROUND OF THE INVENTION

Japanese Patent No. 3867107 discloses a method of using a pulse laser beam for dicing of a semiconductor substrate. This method forms an altered region inside a work piece by means of an optical damage produced by a pulse laser beam. Further, the work piece is cut based on this altered region.

According to a conventional technique, formation of the altered region is controlled using, for example, energy of a pulse laser beam, a spot diameter and a relative movement speed of the pulse laser beam and a target object as parameters.

Further, like a LED (Light Emitting Diode) which has a reflection layer, a metal film such as copper is formed on a surface of a work piece in some cases. There is a method of performing abrasion process of a metal film and an underlying semiconductor or insulator substrate at the same time to cut the work piece using a laser. However, the abrasion process have problems such as generation of scattering objects and a degradation of performance like a loss in brightness of LEDs in a cut surface after dicing.

Another method is to perform a first procedure such as etching only to remove a metal film when a work piece has a metal film, then perform second procedure to form an altered region inside the work piece and cut the work piece. In this case, there is a problem of an increase in the number of procedures for dicing.

SUMMARY OF THE INVENTION

A laser dicing method according to one aspect of the present disclosure is a laser dicing method of a work piece on a surface of which a metal film is provided, and includes: a step of setting the work piece on a stage; a first metal film removing step of irradiating a pulse laser beam defocused from the metal film, along a first line, and removing the metal film; a second metal film removing step of irradiating the pulse laser beam defocused from the metal film, along a second line orthogonal to the first line, and removing the metal film; and a crack forming step of irradiating the pulse laser beam in an area from which the metal film of the work piece is removed, and forming the crack in the work piece, and, in an area in which the first line and the second line cross, irradiation of the pulse laser beam is interrupted in one of the first metal film removing step and the second metal film removing step.

In the method according to the above aspect, preferably, the processed substrate is a substrate on which a LED is formed.

In the method according to the above aspect, preferably, in the first and second metal film removing steps, a clock signal is generated, the pulse laser beam synchronized with the clock signal is emitted, the processed substrate and the pulse laser beam are relatively moved, irradiation and non-irradiation of the pulse laser beam on the processed substrate are switched in light pulse units by controlling passing and blocking of the pulse laser beam using a pulse picker in synchronization with the clock signal, and the metal film is removed, and, in the crack forming step, the processed substrate is set on a stage, the clock signal is generated, the pulse laser beam synchronized with the clock signal is emitted, the work piece and the pulse laser beam are relatively moved, irradiation and non-irradiation of the pulse laser beam on the work piece are switched in light pulse units by controlling passing and blocking of the pulse laser beam using a pulse picker in synchronization with the clock signal, and a crack reaching a substrate surface of the work piece is formed to be continuous in the substrate surface of the work piece by controlling a irradiation energy of the pulse laser beam, a process point depth of the pulse laser beam and lengths of a irradiation area and a non-irradiation area of the pulse laser beam.

In the method according to the above aspect, preferably, in the first or second metal film removing step, a irradiation control signal which includes information of an interruption portion of irradiation of the pulse laser beam is generated, and irradiation of the pulse laser beam in an area in which the first line and the second line cross is interrupted using the irradiation control signal.

In the method according to the above aspect, preferably, the crack is formed substantially linearly in the substrate surface of the work piece.

In the method according to the above aspect, preferably, a position of the work piece and an operation start position of the pulse picker are synchronized.

In the method according to the above aspect, preferably, the work piece includes a sapphire substrate, a quartz substrate or a glass substrate.

In the method according to the above aspect, the first and second metal removing steps and the crack forming step are continuously executed by an identical laser dicing device in a state in which the work piece is set on an identical stage.

A laser dicing method according to one aspect of the present disclosure is a laser dicing method which includes: setting the work piece on a stage; generating a clock signal; emitting the pulse laser beam synchronized with the clock signal; relatively moving the work piece and the pulse laser beam; switching irradiation and non-irradiation of the pulse laser beam on the work piece in light pulse units by controlling passing and blocking of the pulse laser beam using a pulse picker in synchronization with the clock signal; and forming a crack reaching a substrate surface of the work piece to be continuous in the substrate surface of the work piece by controlling a irradiation energy of the pulse laser beam, a process point depth of the pulse laser beam and lengths of a irradiation area and a non-irradiation area of the pulse laser beam, and includes a first crack forming step of irradiating the pulse laser beam on the work piece along a first line; and a second crack forming step of irradiating the pulse laser beam on the work piece along a second line orthogonal to the first line, and, in an area in which the first line and the second line cross, irradiation of the pulse laser beam is interrupted in one of the first crack forming step and the second crack forming step.

In the method according to the above aspect, preferably, the work piece is a substrate on which a LED is formed.

In the method according to the above aspect, preferably, in the first or second crack forming step, a irradiation control signal which includes information of an interruption portion of irradiation of the pulse laser beam is generated, and irradiation of the pulse laser beam in an area in which the first line and the second line cross is interrupted using the irradiation control signal.

In the method according to the above aspect, preferably, the crack is formed substantially linearly in the substrate surface of the work piece.

In the method according to the above aspect, preferably, a position of the work piece and an operation start position of the pulse picker are synchronized.

In the method according to the above aspect, preferably, the work piece includes a sapphire substrate, a quartz substrate or a glass substrate.

The present disclosure can provide a laser dicing method of realizing good cutting performance for a work piece on a surface of which a metal film is formed, by optimizing irradiation conditions of a pulse laser beam.

BRIEF DESCRIPTION OF THE DRAWINGS

FIG. 7 is a view for explaining timing control of the laser dicing method according to the first embodiment;

FIG. 8 is a view illustrating a pulse picker operation of the laser dicing method and a timing of a modulated pulse laser beam PL2 according to the first embodiment;

FIG. 9 is an explanatory view of an irradiation pattern of the laser dicing method according to the first embodiment;

FIGS. 10A to 10C are views illustrating an effect of a metal film removing step of the laser dicing method according to the first embodiment;

FIGS. 16A and 16B are optical pictures of a cut surface in case that cutting is performed under a condition in FIG. 15;

FIGS. 19A to 19E are views illustrating laser dicing results according to Examples 1 to 4 and Comparative Example 1;

FIGS. 21A to 21F are views illustrating laser dicing results according to Examples 5 to 10;

FIGS. 22A to 22E are views illustrating results of a laser dicing according to Examples 11 to 15;

FIGS. 23A to 23F are views illustrating laser dicing results according to Examples 16 to 21;

FIGS. 24A to 24C are views illustrating laser dicing results according to Examples 22 to 24;

FIGS. 25A and 25B are views illustrating laser dicing results according to Example 25.

DETAILED DESCRIPTION OF THE INVENTION

Figure 1:
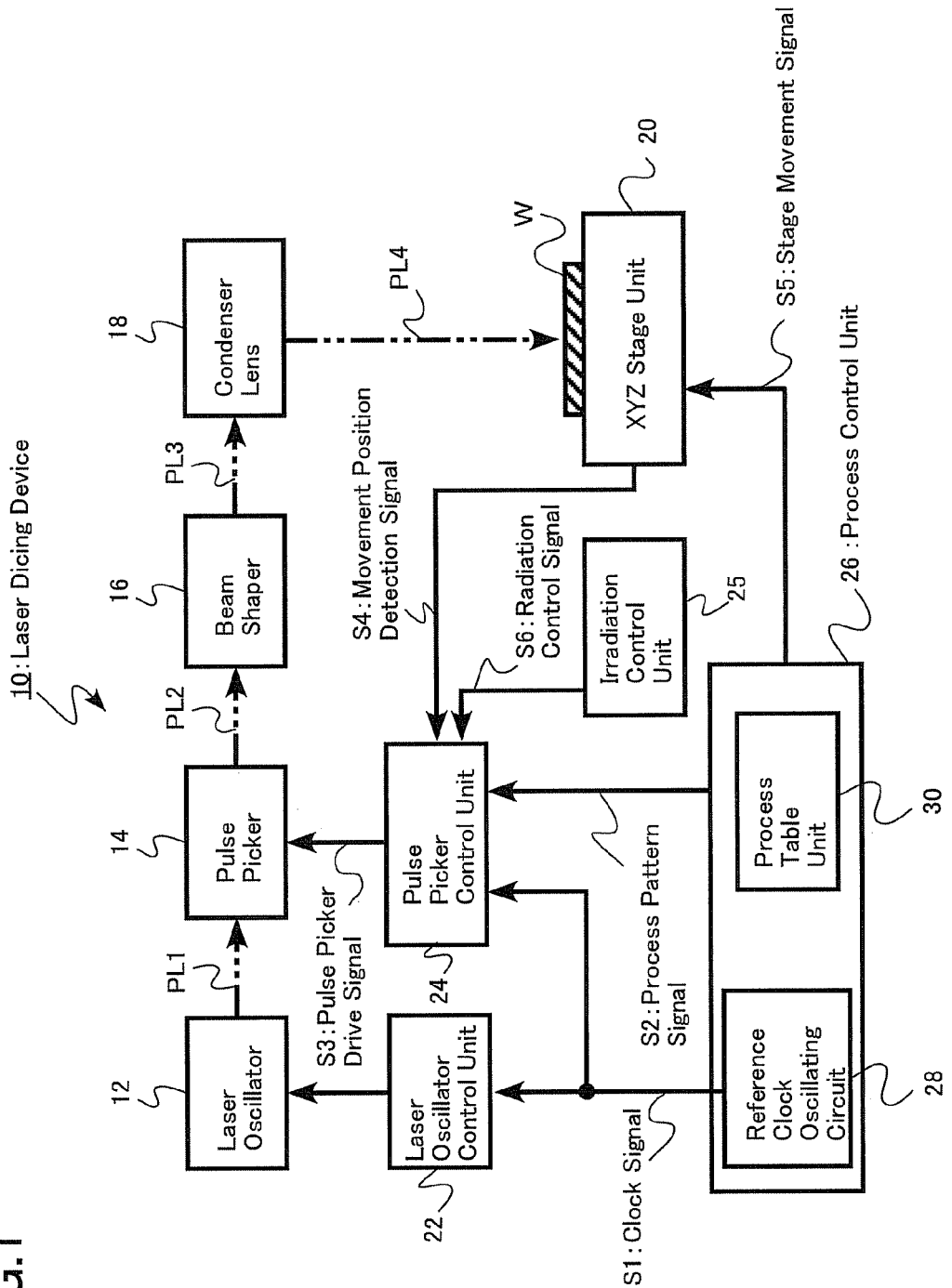
FIG. 1 is a schematic configuration diagram illustrating an example of a laser dicing device used in a laser dicing method according to a first embodiment.

Hereinafter, embodiments of the present disclosure will be described with reference to the drawings. In addition, in this description, a process point is a point near a light condensing position (focus position) in a work piece of a pulse laser beam, and means a point at which the degree of alteration of the work piece maximizes in a depth direction. Further, a process point depth means a depth from a work piece surface of a process point of a pulse laser beam.

Further, in this description, defocusing from a metal film means moving the focus position of the pulse laser beam from a metal film.

First Embodiment

A laser dicing method according to the present embodiment is a laser dicing method of a work piece on a surface of which a metal film is provided. The method includes: a step of setting the work piece on a stage; and a first metal film removing step of irradiating a pulse laser beam defocused from the metal film, along a first line, and removing the metal film. Further, the method includes a second metal film removing step of irradiating the pulse laser beam defocused from the metal film, along a second line orthogonal to the first line, and removing the metal film. Furthermore, the method includes a crack forming step of irradiating the pulse laser beam in an area from which the metal film of the work piece is removed, and forming the crack in the work piece. Still further, in an area in which the first line and the second line cross, irradiation of the pulse laser beam is interrupted in one of the first metal film removing step and the second metal film removing step.

According to the above configuration, it is possible to provide a laser dicing method of realizing good cutting performance for a work piece on a surface of which a metal film is formed. Meanwhile, the good cutting performance includes, for example, (1) there are little scattering objects upon dicing including removing of a metal film, (2) procedure is simple, (3) a cut portion is cut with good linearity, (4) cutting can be performed with a low cutting force such that a packing rate of diced elements improves and (5) elements provided on a work piece such as LED elements formed as a epitaxial layer on a substrate deteriorate due to an influence of a laser radiated upon removing of a metal film or formation of a crack.

Further, by forming a crack which is continuous in a work piece surface, dicing a hard substrate like a sapphire substrate in particular becomes easy. Furthermore, dicing is realized with a narrow dicing width.

In addition, in the metal film removing steps, preferably, a clock signal is generated, the pulse laser beam synchronized with the clock signal is emitted, the work piece and the pulse laser beam are relatively moved, irradiation and non-irradiation of the pulse laser beam on the work piece are switched in light pulse units by controlling passing and blocking of the pulse laser beam using a pulse picker in synchronization with the clock signal, and the metal film is removed. By this means, it is possible to uniformly, stably and precisely remove a metal film.

A laser dicing device according to the present embodiment which realizes the laser dicing method has: a stage on which the work piece can be set; a reference clock oscillating circuit which generates a clock signal; a laser oscillator which emits a pulse laser beam; a laser oscillator control unit which synchronizes the pulse laser beam with the clock signal; and a pulse picker which is provided on an optical path between the laser oscillator and the stage, and which switches irradiation and non-irradiation of the pulse laser beam on the work piece; and a pulse picker control unit which controls passing and blocking of the pulse laser beam in the pulse picker in light pulse units in synchronization with the clock signal.

FIG. 1 is a schematic configuration diagram illustrating an example of the laser dicing device according to the present embodiment. As illustrated in FIG. 1, a laser dicing device 10 according to the present embodiment has as main components a laser oscillator 12, a pulse picker 14, a beam shaper 16, a condenser lens 18, an XYZ stage unit 20, a laser oscillator control unit 22, a pulse picker control unit 24, a irradiation control unit 25 and a process control unit 26. The process control unit 26 has a reference clock oscillating circuit 28 which generates a desired clock signal S1, and a process table unit 30.

The laser oscillator 12 is configured to emit a pulse laser beam PL1 of a cycle Tc synchronized with the clock signal S1 generated by the reference clock oscillating circuit 28. The intensity of radiated pulse light indicates a Gaussian distribution. The clock signal S1 is a process control clock signal used to control laser dicing process.

Meanwhile, a laser wavelength emitted from the laser oscillator 12 uses a transmissive wavelength with respect to a work piece. For a laser, for example, an Nd:YAG laser, an Nd:YVO$_4$ laser or an Nd: YLF laser can be used. When, for example, the work piece is a sapphire substrate with a metal film, an Nd:YVO$_4$ laser including the wavelength of 532 nm is preferably used.

The pulse picker 14 is provided on an optical path between the laser oscillator 12 and the condenser lens 18. Further, the pulse picker is configured to switch irradiation and non-irradiation of the pulse laser beam PL1 on the work piece in light pulse number units by switching passing and blocking (on/off) of the pulse laser beam PL1 in synchronization with the clock signal S1. Thus, on/off of the pulse laser beam PL1 is controlled for process of the work piece by the operation of the pulse picker 14, and becomes a modulated pulse laser beam PL2.

The pulse picker 14 is preferably formed with, for example, an acousto-optic element (AOM). Further, a Raman diffraction electro-optic element (EOM) may also be used.

The beam shaper 16 shapes the incident pulse laser beam PL2 into a pulse laser beam PL3 of a desired shape. The beam shaper is, for example, a beam expander which expands a beam diameter at a fixed magnifying power. Further, for example, an optical element such as a homogenizer which makes a light intensity distribution of a beam cross section uniform may be provided. Furthermore, for example, an element which shapes a beam cross section into a circular shape or an optical element which converts a beam into circular polarized light may also be provided.

The condenser lens 18 condenses the pulse laser beam PL3 shaped by the beam shaper 16, and radiates a pulse laser beam PL4 on a work piece W set on the XYZ stage unit 20 such as a sapphire substrate on which LEDs are formed.

The XYZ stage unit 20 has an XYZ stage (hereinafter, simply referred to as a stage) on which the work piece W can be set and which can move in an XYZ direction, a drive mechanism unit and a position sensor which has a laser interferometer which measures a position of the stage. Meanwhile, the XYZ stage is configured to provide precise positioning precision and movement error in a range of submicrons. Further, when moved in the Z direction, the XYZ stage adjusts the focus position of the pulse laser beam with respect to the work piece W, and controls the process point depth.

The process control unit 26 controls overall process of the laser dicing device 10. The reference clock oscillating circuit 28 generates the desired clock signal S1. Further, the process table unit 30 stores a process table in which dicing process data is described as light pulse numbers of pulse laser beams.

The irradiation control unit 25 stores information of an interruption portion to interrupt irradiation of a pulse laser beam at a portion at which irradiation of pulse laser beams is likely to double upon metal film process or formation of a crack. Further, the irradiation control unit has a function of generating an irradiation control signal (S6) which has information of an interruption portion of irradiation of a pulse laser beam based on the stored information, and transmitting the irradiation control signal to the pulse picker control unit 24. The information of the interruption portion is, for example, a cross point of a dicing line or an XY coordinate which specifies a predetermined range including a cross point.

Figure 2:
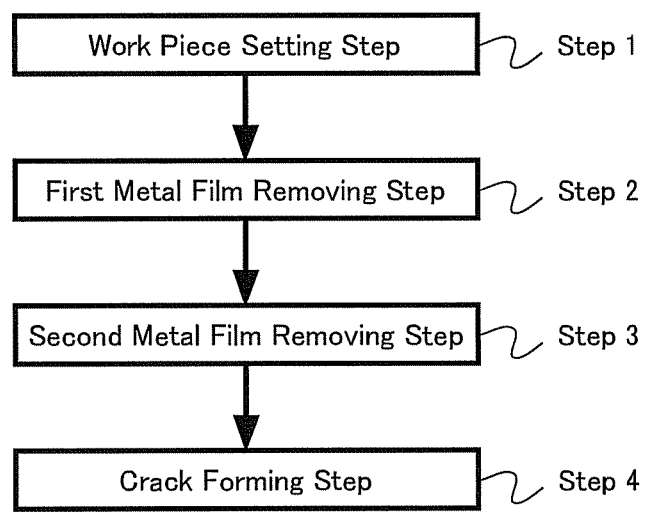
FIG. 2 a procedure flowchart of the laser dicing method according to the first embodiment.
Figure 3:
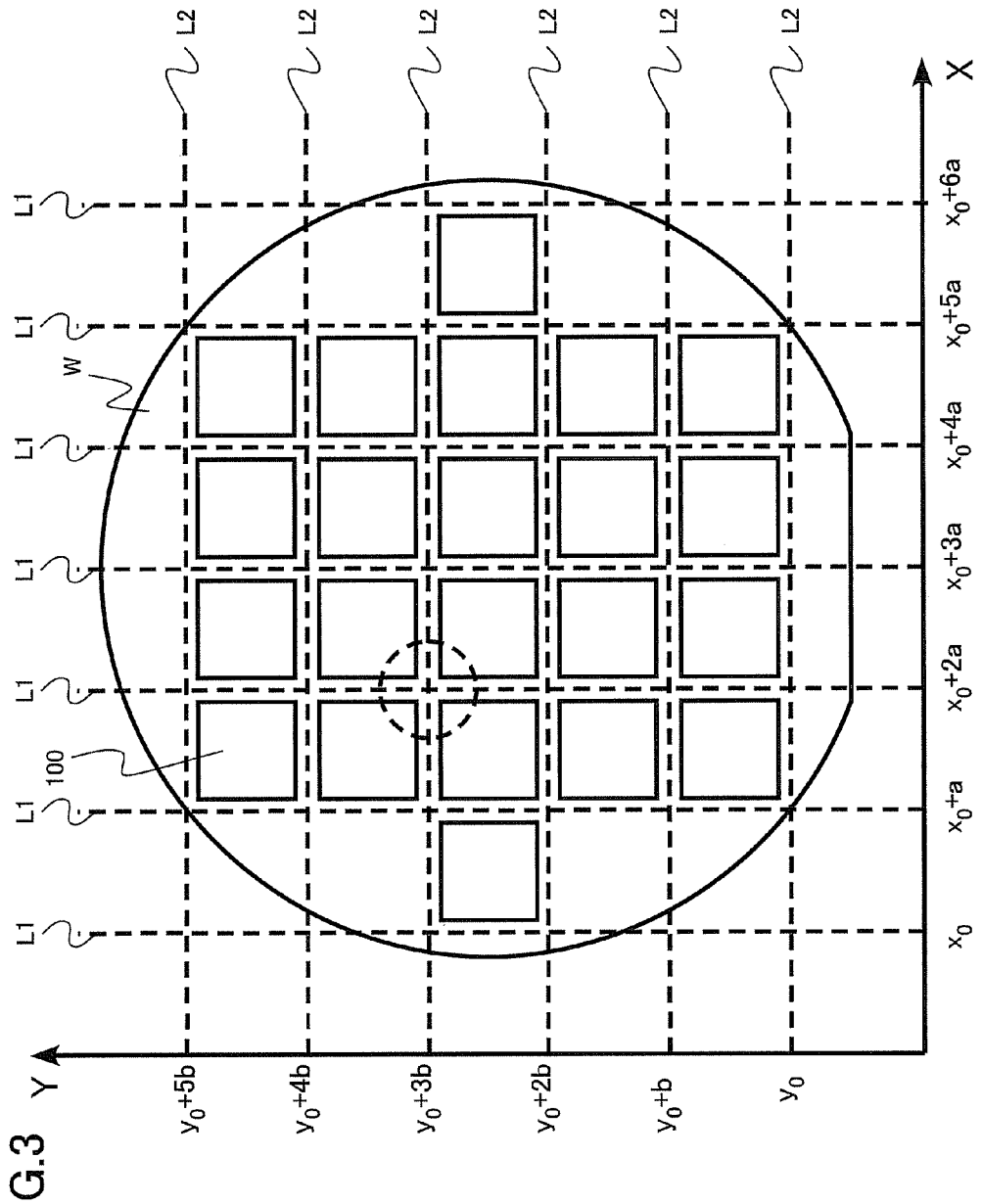
FIG. 3 is an explanatory view of the laser dicing method according the first embodiment.

Next, the laser dicing method using the laser dicing device 10 will be described with reference to the drawings. FIG. 2 is a procedure flowchart of the laser dicing method according to the present embodiment. FIG. 3 is an explanatory view of the laser dicing method according the present embodiment.

First, a step of setting the work piece W on the XYZ stage unit 20 of the laser dicing device 10 is performed (Step 1). The work piece W is, for example, a wafer on which a plurality of LEDs 100 is formed using an epitaxial semiconductor layer on a sapphire substrate.

As illustrated in FIG. 3, a plurality of LEDs 100 is formed on the work piece W. Between the LEDs 100, there is an area which has a predetermined width to individually divide the LEDs 100, that is, a dicing line.

Figure 4:
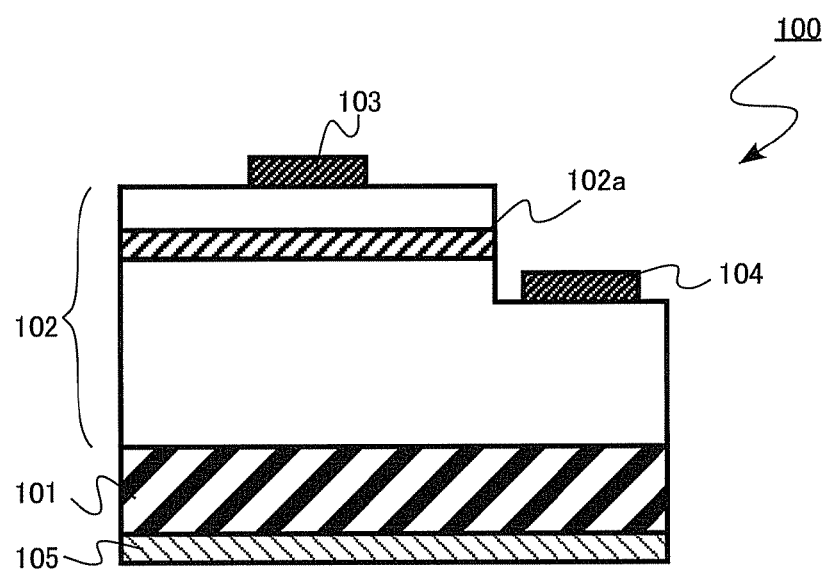
FIG. 4 is a cross-sectional view illustrating an example of a LED according to the first embodiment.

FIG. 4 is a cross-sectional view illustrating an example of the LED 100. As illustrated in FIG. 4, the LED 100 has, for example, a sapphire substrate 101, and a GaN semiconductor layer 102 which is formed by, for example, epitaxial growth on the sapphire substrate 101. The semiconductor layer 102 has a light emitting layer 102a. Further, the semiconductor layer has a first electrode 103 and a second electrode 104 which energize the semiconductor layer 102. Furthermore, the semiconductor layer has a reflection layer 105 of a metal film which reflects light emitted from the light emission layer 102a. The metal film is made of, for example, copper or gold.

In Step 1, the work piece W is set on the XYZ stage unit 20 such that the reflection surface 105 of the metal film of the LED 100 becomes a top surface. Meanwhile, a pitch of an arrangement of the LEDs 100 in the X direction is "a", and a pitch in the Y direction is "b".

Next, a first metal film removing step of irradiating a pulse laser beam defocused from the metal film, along a first line (L1), and removing the metal film is performed (Step 2). Meanwhile, the first line (L1) means a line along the dicing line vertical to the X direction of the work piece. That is, the first line is a line represented by $X=x_0+(n-1)a$ on the XY coordinate. In addition, n=1 to 7 holds in FIG. 3.

Next, a second metal film removing step of irradiating the pulse laser beam defocused from the metal film, along a second line (L2) orthogonal to the first line (L1), and removing the metal film is performed (Step 3). Meanwhile, the second line (L2) means a line along the dicing line vertical to the Y direction of the work piece. That is, the first line is a line represented by $Y=y_0+(k-1)b$ on the XY coordinate. In addition, k=1 to 6 holds in FIG. 3.

Meanwhile, in an area in which the first line (L1) and the second line (L2) cross, irradiation of the pulse laser beam is controlled to interrupt irradiation of the pulse laser beam in the first metal film removing step or the second metal film removing step.

Figure 5:
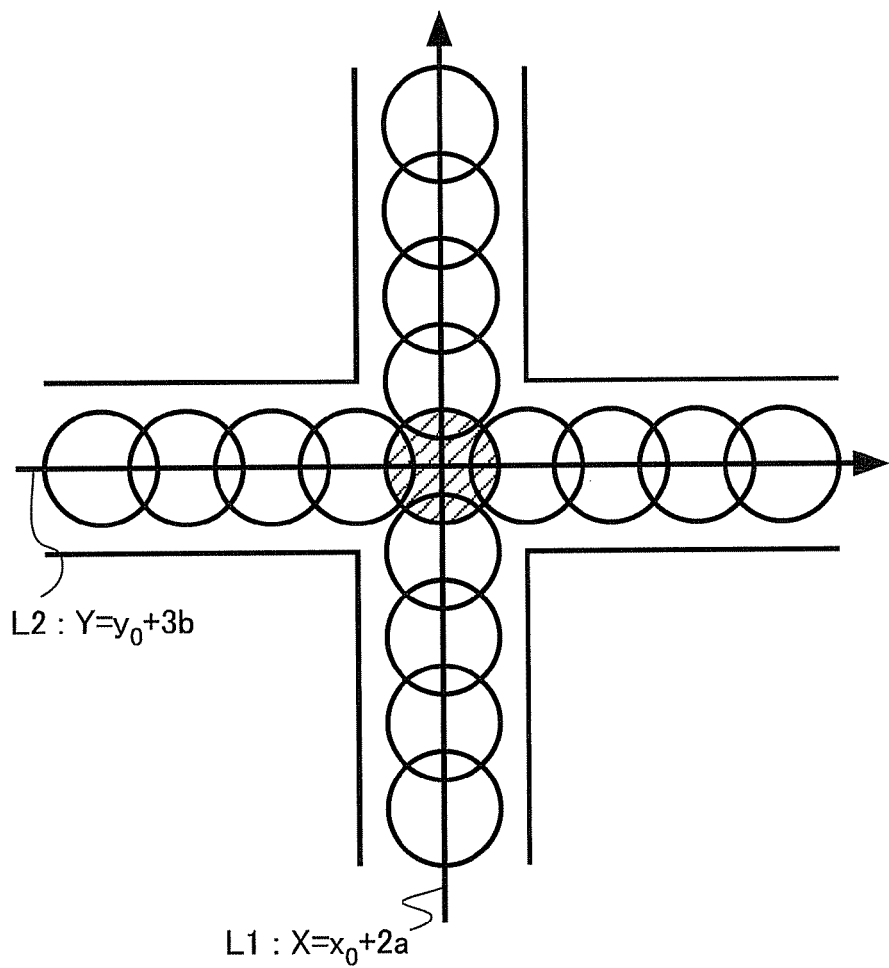
FIG. 5 is an explanatory view of the laser dicing method according to the first embodiment.
Figure 6B:
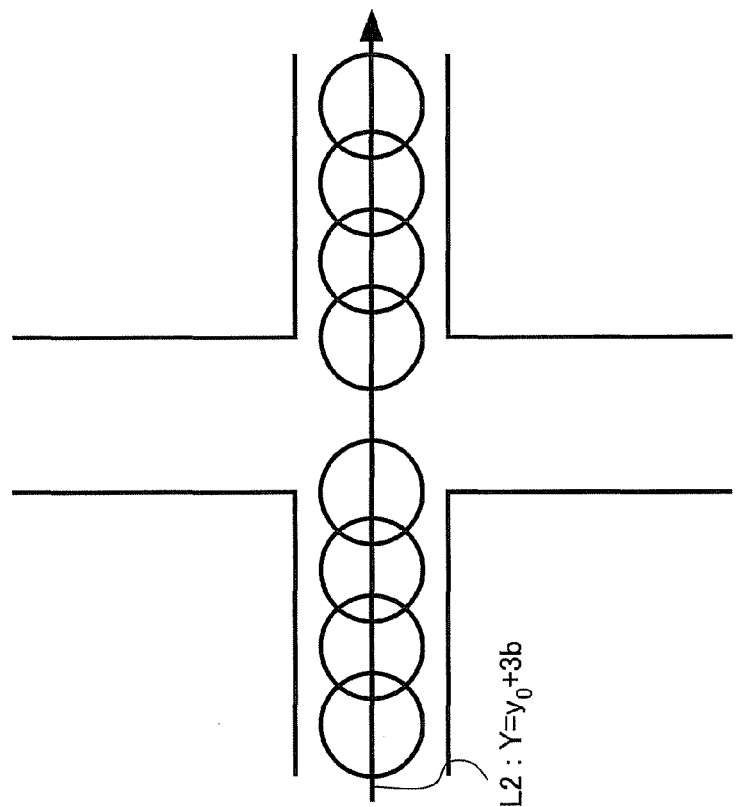
FIGS. 6A and 6B are explanatory views of the laser dicing method according to the first embodiment.
Figure 6A:
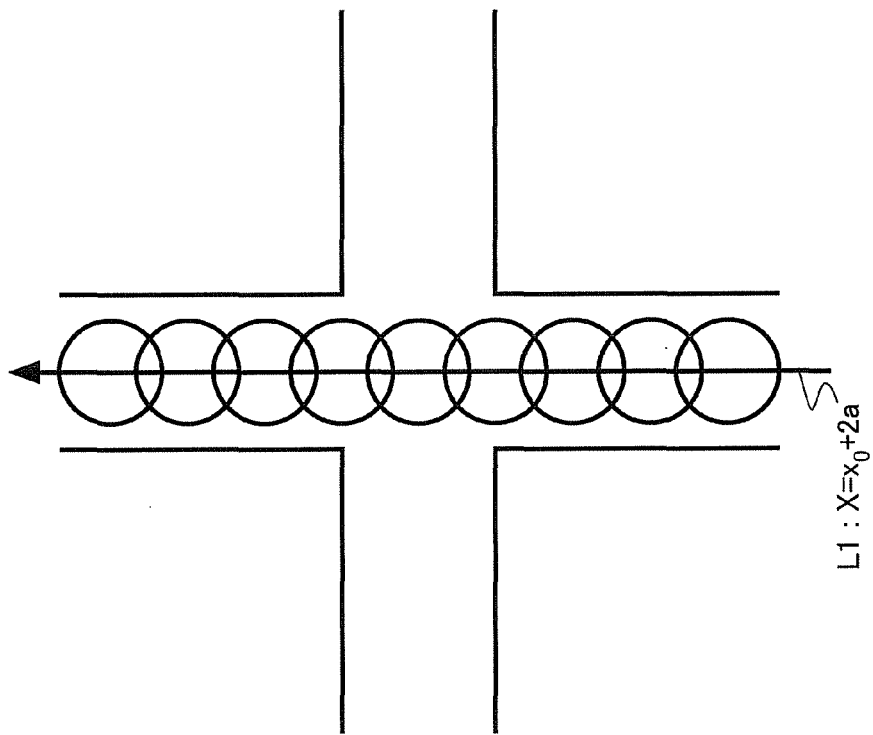

FIGS. 5 and 6A and B are explanatory views of the laser dicing method according the present embodiment. FIG. 5 is an enlarged view of an area encircled by a dotted line circle in FIG. 3. An area is indicated in which the first line (L1) represented by $X=x_0+2a$ and the second line (L2) represented by $Y=y_0+(k-1)b$ cross.

In FIG. 5, each circle indicates a range of the defocused pulse laser beam which is radiated on a metal film surface (work piece W surface). As illustrated in FIG. 5, at a position at which the first line (L1) and the second line (L2) cross, pulse laser beams are doubly radiated at a diagonally hatched circle portion.

If the pulse laser beams are doubly radiated, the metal film has already been removed upon the first irradiation, and therefore energy of the pulse laser beam upon the second irradiation is absorbed to all underlying sapphire substrate 101 and semiconductor layer 102 without being absorbed by the metal film. Hence, the damage on the semiconductor layer 102 becomes significant, and there is a concern that light emission performance of the LEDs 100 deteriorates.

In the present embodiment, in the area in which the first line (L1) and the second line (L2) cross, irradiation of the pulse laser beam is controlled to interrupt irradiation of the pulse laser beam in one of the first metal film removing step and the second metal film removing step. That is, pulse laser beams are prevented from being doubled.

As illustrated in, for example, 6A, in the first metal film removing step, in the area in which the first line (L1) and the second line (L2) cross, that is, at a cross point of the dicing lines, the pulse laser beam is radiated in the same pattern without interrupting irradiation of the pulse laser beam. By contrast with this, as illustrated in FIG. 6B, in the second metal film removing step, in the area in which the first line (L1) and the second line L2) cross, irradiation of the pulse laser beam is interrupted such that pulse laser beams are not doubly radiated. By this means, it is possible to reduce a damage on the semiconductor layer 102 due to the pulse laser beam. Consequently, it is possible to prevent deterioration of the light emission performance of the LEDs 100.

Then, a crack forming step of irradiating the pulse laser beam in the area from which the metal film of the work piece W is removed, and forming the crack in the processed substrate W is performed (Step 4). After this step, for example, an external force is applied to the work piece W, and the work piece W is cut to segment the LEDs 100.

Next, the first and second metal film removing steps (Steps 2 and 3) and the crack forming step (Step 4) will be described in detail. The first and second metal film removing steps (Steps 2 and 3) and the crack forming step (Step 4) can be executed by the same control method using the same laser dicing device except that irradiation condition are optimized upon removing of a metal film and formation of a crack.

First, a substrate which is the work piece W such as the sapphire substrate which has a copper film and on which the LEDs 100 are formed is set on the XYZ stage unit 20. This work piece W is a wafer which has a GaN layer which is formed by epitaxial growth in a lower surface of the sapphire substrate, and on which a plurality of LEDs is formed in this GaN layer. A wafer is positioned with respect to the XYZ stage based on a notch or an orientation flat formed on the wafer.

FIG. 7 is a view for explaining timing control of the laser dicing method according to the present embodiment. In the reference clock oscillating circuit 28 of the process control unit 26, the clock signal S1 of the cycle Tc is generated. The laser oscillator control unit 22 controls the laser oscillator 12 to emit the pulse laser beam PL1 of the cycle Tc synchronized with the clock signal S1. At this time, a delay time $t_1$ is produced upon a rising of the clock signal S1 and a rising of the pulse laser beam.

Laser light having a transmissive wavelength with respect to a work piece is used. In the crack forming step, laser light having greater energy hv of a photon of radiated laser light than band gap Eg of absorption of a work piece material is preferably used. When the energy hv is much greater than the band gap Eg, laser light is absorbed. This is referred to as multiphoton absorption, and, when a pulse width of laser light is significantly reduced to cause multiphoton absorption inside the work piece, energy of multiphoton absorption is not transformed to thermal energy, a perpetual structure change such as ion valence change, crystallization, amorphization, polarization orientation or fine crack formation is induced and a color center is formed.

For the irradiation energy (irradiation power) of this laser light (pulse laser beam), preferably, optimal conditions for removing the metal film are selected in the first and second metal film removing step, and optimal conditions for forming a continuous crack in the work piece surface are selected in the crack forming step.

Further, when the transmissive wavelength is used for the work piece material in the crack forming step, laser light is guided and condensed near the focus inside the substrate. Consequently, the color center can be locally formed. This color center is also referred to as an "altered region" below.

The pulse picker control unit 24 refers to a process pattern signal S2 outputted from the process control unit 26, and generates a pulse picker drive signal S3 synchronized with the clock signal S1. The process pattern signal S2 is stored in the process pattern unit 30, and is generated referring to the process table in which information of the irradiation patterns is described as light pulse numbers in the light pulse units. The pulse picker 14 performs an operation of switching passing and blocking (on/off) of the pulse laser beam PL1 in synchronization with the clock signal S1 based on the pulse picker drive signal S3.

According to this operation of the pulse picker 14, the modulated pulse laser beam PL2 is generated. In addition, delay times $t_2$ and $t_3$ are produced upon a rising of the clock signal S1 and a rising and a falling of the pulse laser beam. Further, delay times $t_4$ and $t_5$ are produced upon a rising and a falling of the pulse laser beam and the pulse picker operation.

Upon process of the work piece, a generation timing of the pulse picker drive signal S3 and a relative movement timing of the work piece and the pulse laser beam are determined taking the delay times $t_1$ to $t_5$ into account.

FIG. 8 is a view illustrating a pulse picker operation of the laser dicing method and a timing of the modulated pulse laser beam PL2 according to the present embodiment. The pulse picker operation is switched in light pulse units in synchronization with the clock signal S1. Thus, by synchronizing oscillation of the pulse laser beam and the pulse picker operation with the same clock signal S1, it is possible to realize an irradiation pattern in the light pulse units.

More specifically, irradiation and non-irradiation of the pulse laser beam are performed based on predetermined conditions defined by the light pulse number. That is, the pulse picker operation is executed based on an irradiation light pulse number (P1) and a non-irradiation light pulse number (P2), and irradiation and non-irradiation on the work piece are switched. The P1 value and the P2 value defined by the irradiation pattern of the pulse laser beam are, for example, defined as a irradiation area register setting and a non-irradiation register setting in the process table. The P1 value and the P2 value are set to predetermined conditions of optimizing removing of the metal film in the metal film removing step and formation of the crack in the crack forming step based on materials of the metal film and the work piece and a laser beam condition.

The modulated pulse laser beam PL2 is shaped into a pulse laser beam PL3 of a desired shape by the beam shaper 16. Further, the shaped pulse laser beam PL3 is condensed by the condenser lens 18 and becomes the pulse laser beam PL4 having a desired beam diameter, and is radiated on the wafer which is the work piece.

When the wafer is diced in the X axis direction and in the Y axis direction, for example, the XYZ stage is moved at a fixed speed in the Y axis direction, and the pulse laser beam PL4 is scanned. Further, after dicing in the desired Y axis direction is finished, the XYZ stage is moved at a fixed speed in the X axis direction, and the pulse laser beam PL4 is scanned. By this means, dicing in the X axis direction is performed.

An interval between irradiation and non-irradiation of a pulse laser beam is controlled based on the irradiation light pulse number (P1), the non-irradiation light pulse number (P2) and the stage speed.

In the Z axis direction (height direction), the light condensing position (focus position) of the condenser lens is adjusted to the position of a predetermined depth inside and outside the wafer. This predetermined depth is set such that, in the metal film removing step and the crack forming step, the metal film is removed in a desired state and the crack is formed into a desired shape in the work piece surface.

In this case,
when a tropism rate of the work piece: n,
a process position from the work piece surface: L,
and the Z axis movement distance: Lz hold,
Lz=L/n holds. That is, when the surface of the work piece is a Z axis initial position, the light condensing position of the condenser lens is processed at a position of a depth "L" from the substrate surface, the Z axis only needs to move by "Lz".

FIG. 9 is an explanatory view of an irradiation pattern of the laser dicing method according to the present embodiment. As illustrated, the pulse laser beam PL1 is generated in synchronization with the clock signal S1. Further, by controlling passing and blocking of the pulse laser beam in synchronization with the clock signal S1, the modulated pulse laser beam PL2 is generated.

Furthermore, by moving the stage in the horizontal direction (the X axis direction or the Y axis direction), the irradiation light pulse of the modulated pulse laser beam PL2 is formed as an irradiation spot on the wafer. Thus, by generating the modulated pulse laser beam PL2, the irradiation spot is controlled in the light pulse units and intermittently radiated on the wafer. In case of FIG. 9, a condition that the irradiation light pulse number (P1)=2 and the non-irradiation light pulse number (P2)=1 are set, and the irradiation light pulse (Gaussian light) repeats irradiation and non-irradiation at a pitch of the spot diameter is set.

Meanwhile, process is performed under a condition of a beam spot diameter: D (μm) and a repetition frequency: F (KHz), a stage movement speed V (m/sec) for repeating irradiation and non-irradiation of a irradiation light pulse at a pitch of a spot diameter is V=D×10$^{-6}$×F×10$^3$.

For example, when process is performed under a process condition of the beam spot diameter: D=2 μm and the repetition frequency: F=50 KHz, the stage movement speed: V=100 mm/sec holds.

Further, when irradiation light power is P (watt), a light pulse of irradiation pulse energy P/F per pulse is radiated on the wafer.

Parameters of the irradiation energy (irradiation light power) of the pulse laser beam, a process point depth of the pulse laser beam and the interval between irradiation and non-irradiation of the pulse laser beam are determined such that the metal film is removed in the metal film removing step and the crack is formed to be continuous in the work piece surface in the crack forming step.

As described above, the laser dicing method according to the present embodiment forms a crack in the work piece which has the metal film and cuts the work piece in three steps of the first and second metal film removing steps and the crack forming step. In this case, preferably, the first and second metal film removing steps and the crack forming step are continuously executed by an identical laser dicing device in a state in which the work piece is set on an identical stage from a view point of simplification of dicing procedure.

In the first and second metal film removing steps, the laser dicing device is used to set the work piece on the stage, radiate the pulse laser beam defocused from the metal film such as copper or gold and remove the metal film.

FIGS. 10A to 10C are views illustrating an effect of metal film removing step of the laser dicing method according to the present embodiment. FIG. 10A is an optical picture of a top surface of the work piece after laser irradiation, FIG. 10B is table illustrating focus positions of a pulse laser beam and a removing width of the metal film, and FIG. 10C is a view graphically illustrating FIG. 10B.

Removing of the metal film illustrated in FIGS. 10A to 10C is performed under the following laser process condition.
Work piece: Sapphire substrate with metal film (copper)
Laser light source: Nd:YVO$_4$ laser
Wavelength: 532 nm
Radiation energy: 100 mW
Laser frequency: 100 KHz
Radiation light pulse number (P1): 1
Non-irradiation light pulse number (P2): 1
Stage speed: 5 mm/sec
Focus position: −5 μm to 55 μm (by 5 μm)

In addition, as to the focus position, an interface between the metal film and an underlying sapphire is 0, a negative value is in a work piece internal direction and a positive value is in a direction apart from the work piece.

As are clear from FIGS. 10A to 10C, particularly by defocusing the pulse laser beam from the metal film and irradiating the pulse laser beam, the metal film is removed. As is clear from FIG. 10, by setting the focus position to a position which is 25 μm in a direction opposite to the sapphire from the interface between the metal film and the sapphire, the metal film is the most widely removed.

In the present embodiment, by using the difference between energy absorption rates of the metal film and an underlying substrate such as the sapphire, it is possible to minimize a damage on the underlying substrate and remove only the metal film.

From a view point of preventing a damage on the underlying substrate due to that the focus position of the pulse laser beam comes to the underlying substrate, the focus position is preferably defocused to an outside of the work piece.

In addition, in the area in which the first line (L1) and the second line (L2) cross, irradiation of the pulse laser beam can be interrupted according to, for example, the following method.

The irradiation control unit 25 stores information which specifies a range of irradiation of the pulse laser beam to be interrupted as the XY coordinate in the first or second metal film removing procedure. This information is, for example, a XY coordinate range of a cross point of the first line (L1) and the second line (L2) or the XY coordinate range including the cross point. This information is transmitted to the pulse picker control unit 24 as the irradiation control signal (S6).

The pulse picker control unit 24 controls irradiation of the pulse laser beam based on both of the process pattern signal (S2) and the irradiation control signal (S6). Further, in an area in which the first line (L1) and the second line (L2) cross, irradiation of the pulse laser beam is interrupted in the first or second metal film removing step.

Then, a crack forming step of removing the metal film, then irradiating the pulse laser beam in the area from which the metal film of the work piece W is removed, and forming the crack in the work piece W is performed.

Figure 11:
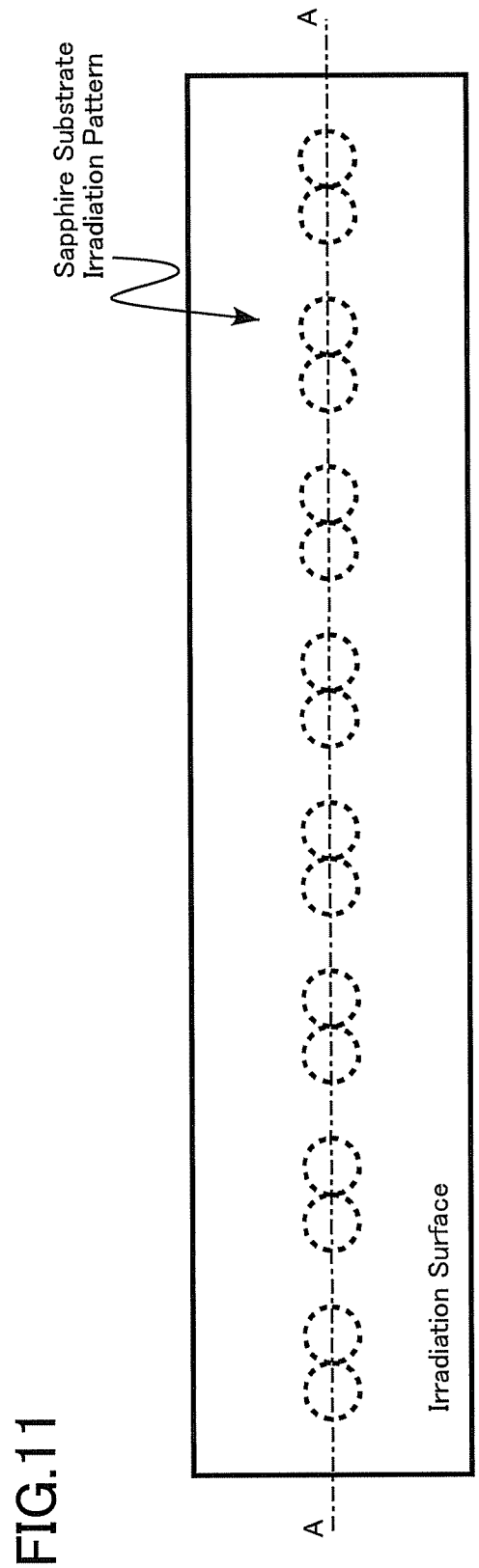
FIG. 11 is a top view illustrating an irradiation pattern radiated on a sapphire substrate in a crack forming step according to the first embodiment.

FIG. 11 is a top view illustrating an irradiation pattern radiated on a sapphire substrate in the crack forming step. When a irradiation surface is seen from above, a irradiation spot is formed at a pitch of the irradiation spot diameter with the irradiation light pulse number (P1)=2 and the non-irradiation light pulse number (P2)=1.

Figure 12:
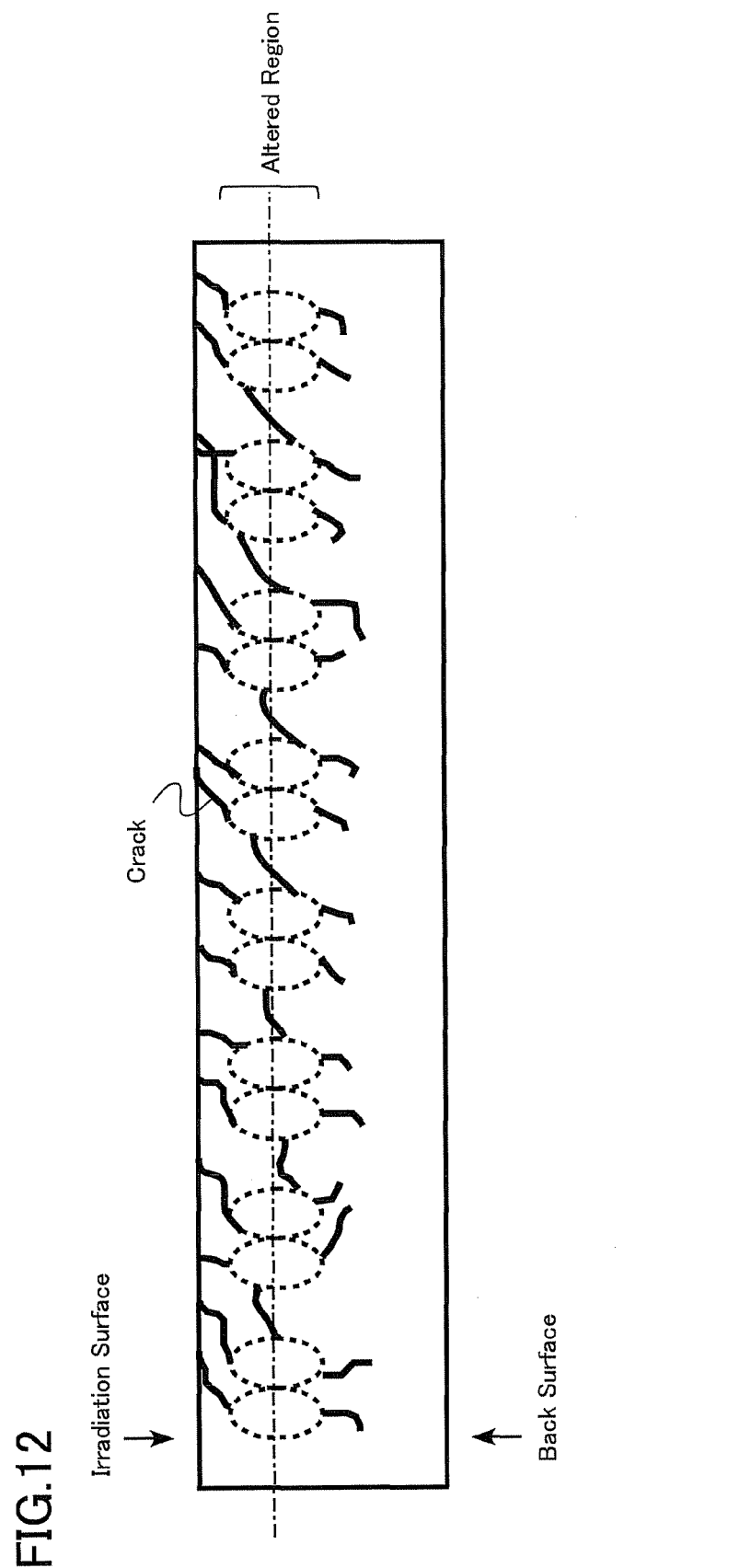
FIG. 12 is an AA cross-sectional view of FIG. 11.

FIG. 12 is an AA cross-sectional view of FIG. 11. As illustrated, an altered region is formed inside the sapphire substrate. Further, a crack (or a groove) reaching a substrate surface along a scan line of a light pulse from this altered region is formed. Further, this crack is formed to be continuous in the work piece surface. In addition, in the present embodiment, the crack is formed such that the crack is exposed only on the substrate surface side, and does not reach the substrate back surface side.

Figure 13:
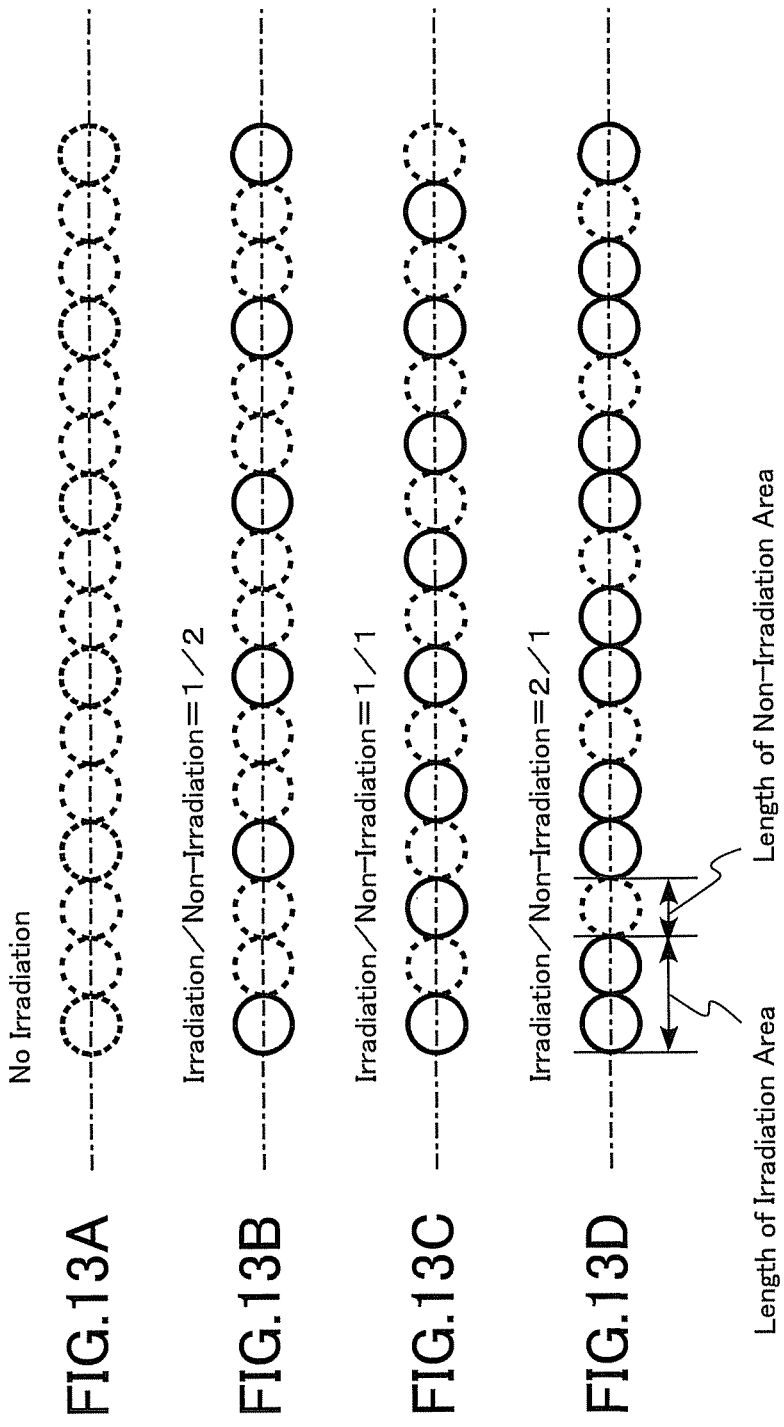
FIGS. 13A to 13D are explanatory views of a function according to the first embodiment.

FIGS. 13A to 13D are explanatory views of a function according to the present embodiment. For example, positions on which pulses can be radiated in case that a pulse laser is radiated at a maximum laser frequency of a pulse laser beam which can be set and at a maximum stage speed which can be set are indicated by dotted line circles in FIG. 13A. FIG. 13B illustrates an irradiation pattern in case of irradiation/non-irradiation=½. Solid line circles are irradiation positions, and dotted line circles are non-irradiation positions.

Meanwhile, making an interval between irradiation spots (a length of a non-irradiation area) shorter is assumed to provide good cutting performance. In this case, as illustrated in FIG. 13C, irradiation/non-irradiation=1/1 can be set without changing the stage speed. If the stage speed needs to be decreased to cause the same condition when a pulse picker is not used as in the present embodiment, there is a problem of a decrease in throughput of dicing process.

Meanwhile, making longer the length of the irradiation area by making the irradiation spot continuous is assumed to provide good cutting performance. In this case, as illustrated in FIG. 13D, irradiation/non-irradiation=2/1 can be set without changing the stage speed. If the stage speed needs to be decreased and the stage speed needs to be fluctuated to provide the same condition when a pulse picker is not used as in the present embodiment, there is a problem of a decrease in throughput of dicing process and significant difficulty in control.

Alternatively, although, when the pulse picker is not used, a condition similar to that of FIG. 13D can be provided by increasing irradiation energy according to the irradiation pattern in FIG. 13B, in this case, laser power concentrating on one point increases, and there is a concern of an increase in a crack width and deterioration of linearity of a crack. Further, when a work piece in which LED elements are formed on a sapphire substrate is processed, there is a concern that the amount of laser reaching an LED area on a side opposite to a crack increases and the LED elements deteriorate.

Thus, according to the present embodiment, it is possible to realize various cutting conditions without changing a pulse laser beam condition or a stage speed condition, and find an optimal cutting condition without deteriorating productivity and element performance.

In addition, in the description, "the length of the irradiation area" and "the length of the non-irradiation area" refer to lengths illustrated in FIG. 13D.

Figure 14:
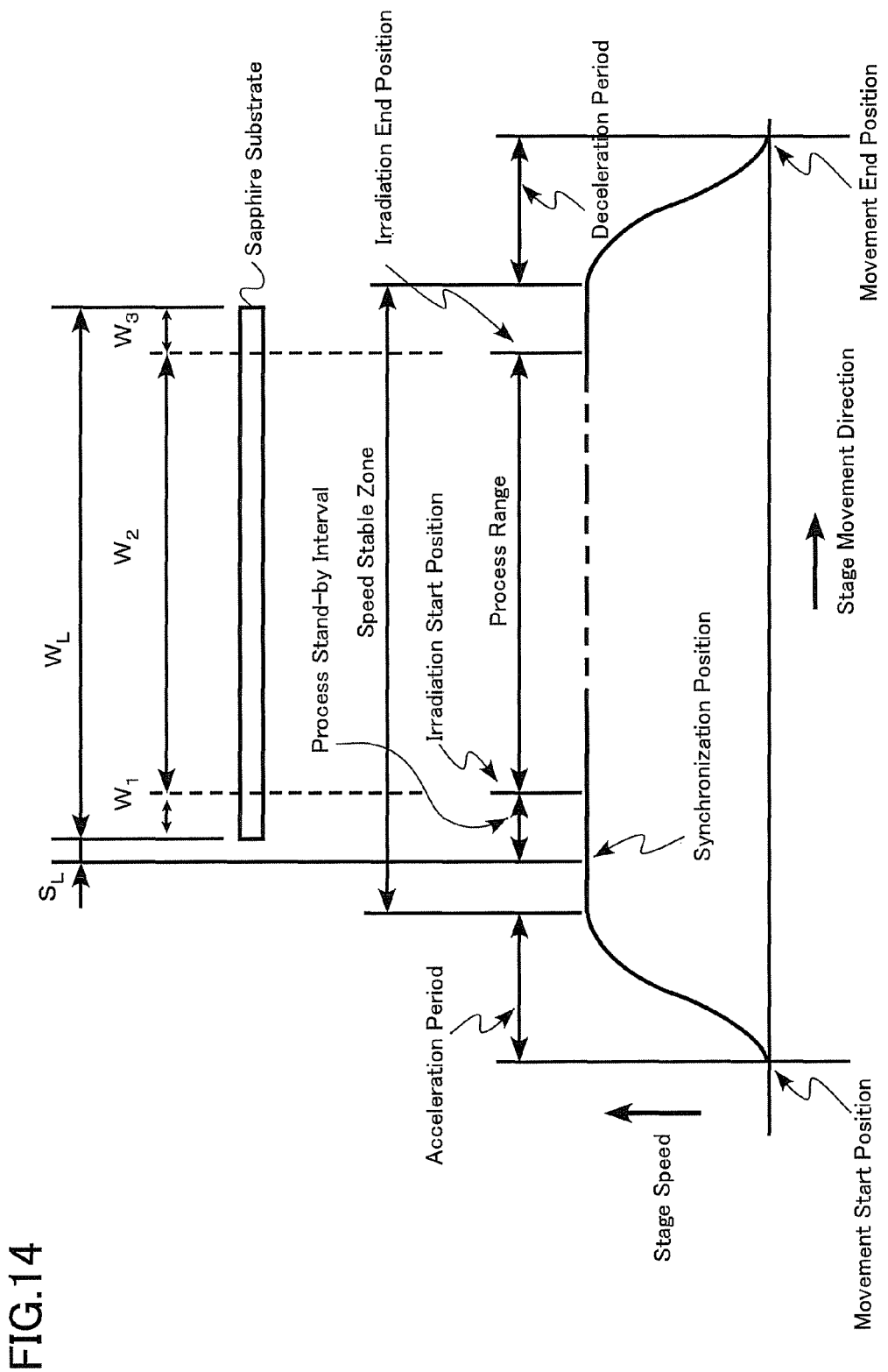
FIG. 14 is a view for explaining a relationship between stage movement and dicing process according to the first embodiment.

FIG. 14 is a view for explaining a relationship between stage movement and dicing process. The XYZ stage is provided with a position sensor which detects in movement positions in the X axis and Y axis directions. For example, after the stage starts moving in the X axis or Y axis direction, a position at which the stage speed enters a speed stable zone is set as a synchronization position. Further, when the synchronization position is detected by the position sensor, a movement position detection signal S4 (FIG. 1) is outputted to the pulse picker control unit 24 to allow a pulse picker operation and operate the pulse picker according to the pulse picker drive signal S3. The synchronization position is, for example, an end surface of the work piece, and this end surface is detected by the position sensor.

Thus, $S_L$: a distance from the synchronization position to the substrate, $W_L$: process length, $W_1$: a distance from a substrate end to a irradiation start position, $W_2$: a process range, and $W_3$: a distance from an irradiation end position to the substrate end are managed.

Thus, the position of the stage, the position of the work piece set on the stage and an operation start position of the pulse picker are synchronized. That is, irradiation and non-irradiation of the pulse laser beam are synchronized with the position of the stage. Hence, upon irradiation and non-irradiation of the pulse laser beam that the stage moves at a fixed speed (speed stable zone) is secured. Consequently, it is possible to secure regularity of an irradiation spot position and realize stable formation of a crack.

Meanwhile, when a thick substrate is processed, cutting performance is improved by scanning an identical scan line a plurality of (a plurality of layers of) substrates by means of pulse laser beams of different process point depths, and forming a crack. In this case, by synchronizing the stage position and the operation start position of the pulse picker, it is possible to arbitrarily and precisely control a relationship between pulse irradiation positions upon scan at different depths, and optimize the dicing condition.

Figure 15A:
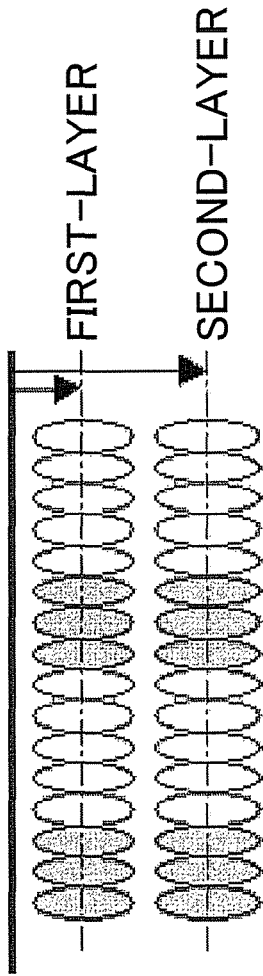
FIGS. 15A and 15B are explanatory views in case that pulse laser beams of different process point depths scan an identical scan line of a plurality of substrates to form a crack according to the first embodiment.
Figure 15B:
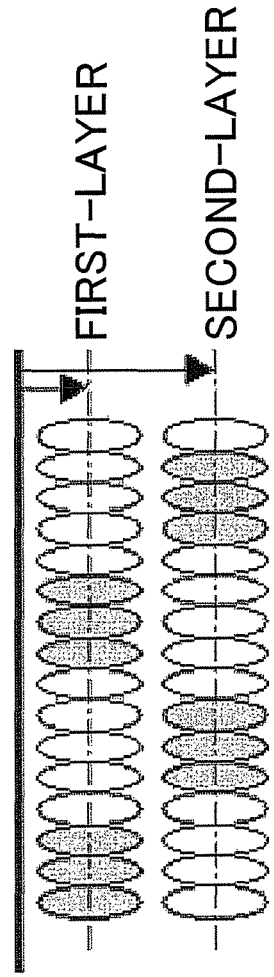

FIGS. 15A and 15B are explanatory views in case that pulse laser beams at different process point depths scan an identical scan line of a plurality of substrates to form a crack.

FIGS. 15A and 15B are schematic views of irradiation patterns in a substrate cross section. ON (colored) refers to irradiation areas, and OFF (white) refers to non-irradiation areas. FIG. 15A illustrates that a first layer and a second layer to scan upon irradiation are in-phases, that is, irradiation pulse positions in the first layer and the second layer have an aligned vertical relationship. FIG. 15B illustrates that a first layer and a second layer to scan upon irradiation are out-of-phases, that is, irradiation pulse positions in the first layer and the second layer have a misaligned vertical relationship.

FIGS. 16A and 16B are optical pictures of a cut surface in case that cutting is performed under a condition in FIG. 15. FIG. 16A illustrates an in-phase, and FIG. 16B illustrates an out-of-phase. Upper side pictures show low magnifying power, and lower side pictures show high magnifying power. Thus, the stage position and the operation start position of the pulse picker synchronize, so that it is possible to more precisely control the relationship between the first layer and the second layer to scan upon irradiation.

In addition, the work piece illustrated in FIGS. 16A and 16B is a sapphire substrate having the thickness of 150 μm. In this case, the cutting force required for cutting is 0.31 N in case of the in-phase and is 0.38 N in case of the out-of-phase, and the in-phase provides better cutting performance.

In addition, although a case has been described as an example where the pulse numbers upon irradiation/non-irradiation are the same between the first layer and the second layer, it is also possible to find the optimal condition as different pulse numbers upon irradiation/non-irradiation between the first layer and the second layer.

Further, synchronizing movement of a stage with a clock signal is preferable to further improve precision of an irradiation spot position. This can be realized by, for example, synchronizing with the clock signal S1 the stage movement signal S5 (FIG. 1) outputted from the process control unit 26 to the XYZ stage unit 20.

Like the laser dicing method according to the present embodiment, by forming a crack which reaches a substrate surface and which is continuous in the work piece surface, cutting a substrate becomes easy. Even when, for example, a substrate is a hard substrate like a sapphire substrate, by artificially applying a force at a point of time when a crack reaching the substrate surface is cut or fractured, it is possible to easily perform cutting and realize good cutting performance. Consequently, productivity of dicing improves.

A method of continuously irradiating a pulse laser beam on a substrate in the crack forming step has difficulty in controlling the crack which is formed to be continuous in the substrate surface into a desired shape even if a stage movement speed, a numerical aperture of the condenser lens an irradiation power are optimized. As in the present embodiment, by intermittently switching irradiation and non-irradiation of a pulse laser beam in light pulse units and optimizing a irradiation pattern, generation of a crack reaching a substrate surface is controlled and a the laser dicing method which has good cutting performance is realized.

That is, for example, it is possible to form on the substrate surface a crack of a narrow width which is substantially linearly continuous along a scan line of a laser. By forming such a crack which is substantially linearly continuous, it is possible to minimize an influence of a crack on devices such as LEDs formed on a substrate upon dicing. Further, for example, it is possible to form a linear crack, and narrow the width of an area in which a crack is formed in the substrate surface. Consequently, it is possible to narrow a dicing width of design. Consequently, it is possible to increase the number of chips of devices formed on an identical substrate or wafer, and reduce manufacturing cost of the devices.

In addition, in an area in which the first line (L1) and the second line (L2) cross, irradiation of the pulse laser beam is interrupted in one of the first metal film removing step and the second metal film removing step.

Further, the method of interrupting irradiation of a pulse laser beam can control an irradiation pattern independently from a process table stored in the process table unit 30 by using the irradiation control unit 25 as described above. Consequently, even when, for example, the arrangement pitches "a" and "b" of the LEDs 100 change, it is possible to provide an advantage of easily changing an irradiation pattern.

Naturally, for example, to simplify a configuration of the laser dicing device, irradiation may be interrupted by describing an interruption position of irradiation of a pulse laser beam in the process table unit stored in the process table unit 30 in advance.

Figure 17B:
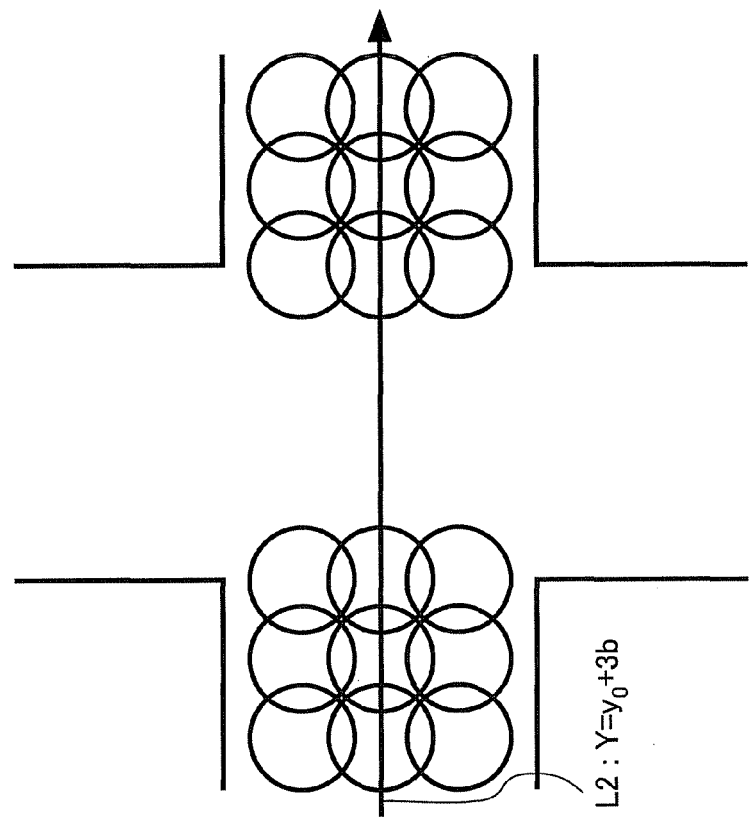
FIGS. 17A and 17B are explanatory views of a laser dicing method according to Modified Example of the first embodiment.
Figure 17A:
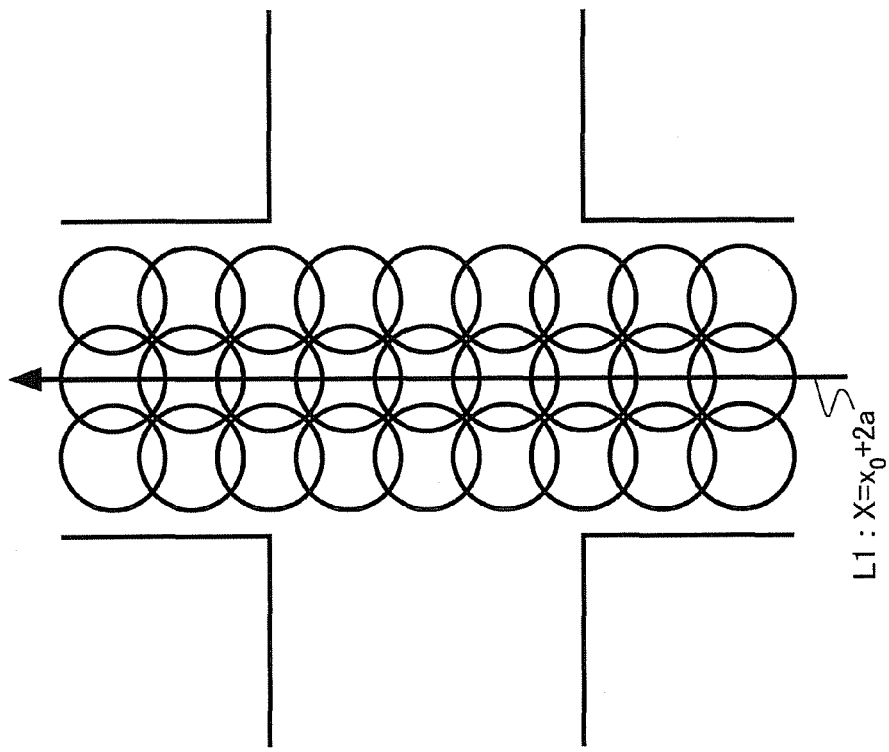

FIGS. 17A and 17B are explanatory views of a laser dicing method according to Modified Example of the present embodiment. Although a case has been described as an example where one array of a pulse layer beam is radiated in the first and second metal film removing steps, a plurality of arrays of parallel pulse laser beams which are three arrays in FIGS. 17A and 17B may be radiated along the first line (L1) and the second line (L2) as illustrated in FIGS. 17A and 17B to improve performance to remove the metal film. In this case, irradiation of a pulse laser beam in an area in which the first line (L1) and the second line (L2) cross is interrupted. FIGS. 17A and 17B illustrate cases that irradiation of the pulse beam is interrupted in the second metal film removing step of irradiating the pulse laser beams along the second line (L2).

Further, also in the crack forming step, a plurality of arrays of parallel pulse laser beams may be radiated along the first line (L1) or the second line (L2) to improve crack forming performance.

Second Embodiment

A laser dicing method according to the present embodiment includes: setting the work piece on a stage; generating a clock signal; emitting the pulse laser beam synchronized with the clock signal; relatively moving the work piece and the pulse laser beam; switching irradiation and non-irradiation of the pulse laser beam on the work piece in light pulse units by controlling passing and blocking of the pulse laser beam using a pulse picker in synchronization with the clock signal; and forming a crack reaching a substrate surface of the work piece to be continuous in the substrate surface of the work piece by controlling a irradiation energy of the pulse laser beam, a process point depth of the pulse laser beam and lengths of a irradiation area and a non-irradiation area of the pulse laser beam. Further, the method includes: a first crack forming step of irradiating the pulse laser beam on the work piece along a first line; and a second crack forming step of irradiating the pulse laser beam on the work piece along a second line orthogonal to the first line. In an area in which the first line and the second line cross, irradiation of the pulse laser beam is interrupted in one of the first crack forming step and the second crack forming step.

In the first embodiment, a method of, in an area in which the first line and the second line cross, interrupting irradiation of the pulse laser beam in one the first metal film removing step and the second metal film removing step to radiate a pulse laser beam and remove a metal film. In the present embodiment, the same method as that in the first embodiment is adopted to radiate a pulse laser beam and form a crack. That is, in an area in which the first line and the second line cross, irradiation of the pulse laser beam is interrupted in one of the first crack forming step and the second crack forming step. Consequently, it is possible to realize the laser dicing method according to the present embodiment by replacing the first and second metal film removing steps according to the first embodiment with the first and second crack forming steps. Hence, content which overlaps that in the first embodiment will not be described.

In addition, in the present embodiment, the work piece W does not necessarily have a metal film.

According to the above configuration, it is possible to avoid double irradiation of pulse laser beams for forming a crack, at a cross point of dicing lines. Consequently, it is possible to prevent an excessive damage on a semiconductor layer 102 (FIG. 4) and deterioration of light emission performance of LEDs 100.

Further, upon dicing of a work piece W which has a metal film, by performing a laser dicing method which adopts the first embodiment and the present embodiment, it is possible to further suppress a damage on the semiconductor layer 102 and further suppress deterioration of the light emission performance of the LEDs 100.

Hereinafter, an embodiment of this present disclosure will be described with reference to specific examples. However, the present invention is by no means limited to these specific examples. Although, in the embodiment, components of a laser dicing method and a laser dicing device which are not directly necessary for description of this present disclosure will not be described, the required elements related to the laser dicing method and the laser dicing device can be adequately selected and used.

In addition, all laser dicing methods which have elements of the present disclosure and which can be adequately changed by one of ordinary skill in art are incorporated in the scope of the present disclosure. The scope of the present disclosure is defined by the claims and equivalents thereof.

For example, in the embodiment, a substrate in which LEDs are formed on a sapphire substrate has been described as a work piece. Although the present disclosure is useful for a substrate which is hard like a sapphire substrate, has poor cleavage and is difficult to cut, work pieces may be substrates including a semiconductor material substrate such as SiC (silicon carbide) substrate, a piezoelectric material, a quartz substrate and a glass substrate such as quartz glass.

Further, in the embodiment, a case has been described where the work piece and the pulse laser beam are relatively moved by moving the stage. However, a method of relatively moving a work piece and a pulse laser beam by, for example, using a laser beam scanner and scanning a pulse laser beam may be adopted.

Further, although a case has been described with the embodiment where a irradiation light pulse number (P1)=2 and a non-irradiation light pulse number (P2)=1 are set in the crack forming step, values of P1 and P2 can take arbitrary values to set an optimal condition. Furthermore, although the case has been described with the embodiment as an example where an irradiation light pulse repeats irradiation and non-irradiation at a pitch of a spot diameter, it is possible to find the optimal condition while changing pitches of irradiation and non-irradiation by changing a pulse frequency or a stage movement speed. For example, it is also possible to make pitches of irradiation and non-irradiation 1/n or n times.

Particularly when a work piece is a sapphire substrate, by setting irradiation energy to 30 mW or more and 150 mW or less and setting a irradiation interval to 1 to 6 μm by allowing a pulse laser beam to pass in 1 to 4 pulse units and to be blocked in 1 to 4 light pulse units, it is possible to form a crack of good continuity and linearity in a work piece surface.

Further, by, for example, providing a plurality of irradiation area registers and non-irradiation area registers for removing of a metal film and a dicing process pattern, and changing irradiation area register and non-irradiation area register values in real time at desired timings to desired values, it is possible to support various dicing process patterns.

Furthermore, a device which has a process table unit which stores a process table in which metal film removing data or dicing process data are described as light pulse numbers of pulse laser beams has been described as an example of a laser dicing device. However, the device does not necessarily have this process table unit, and only needs to employ a configuration of controlling passing and blocking of a pulse laser beam in a pulse picker in light pulse units.

Further, it is also possible to employ a configuration of forming which is continuous in a substrate surface, irradiating a laser on a surface and applying melting process or abrasion process to the surface to further improve cutting performance.

EXAMPLE

Hereinafter, examples of a crack forming step according to the present disclosure will be described.

Example 1

Laser dicing was performed under the following condition according to the method disclosed in the embodiment.

Figure 18:
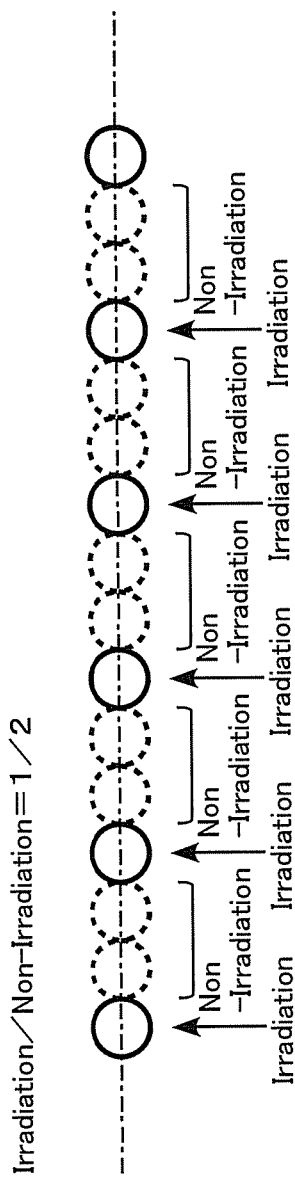
FIG. 18 is a view illustrating an irradiation pattern according to Example 1.

Work piece: Sapphire substrate, substrate thickness 100 μm
Laser light source: Nd:YVO$_4$ laser
Wavelength: 532 nm
Radiation energy: 50 mW
Laser frequency: 20 KHz
Radiation light pulse number (P1): 1
Non-irradiation light pulse number (P2): 2
Stage speed: 25 mm/sec
Process point depth: About 25.2 μm from work piece surface FIG. 18 is a view illustrating an irradiation pattern according to Example 1. As illustrated, after a light pulse is radiated once, non-irradiation is maintained for two pulses in light pulse units. After this condition, this is described in a format of irradiation/non-irradiation=½. In addition, pitches of irradiation and non-irradiation are equal to a spot diameter.

In case of Example 1, the spot diameter was about 1.2 μm. Hence, an irradiation interval was about 3.6 μm.

Figure 20:
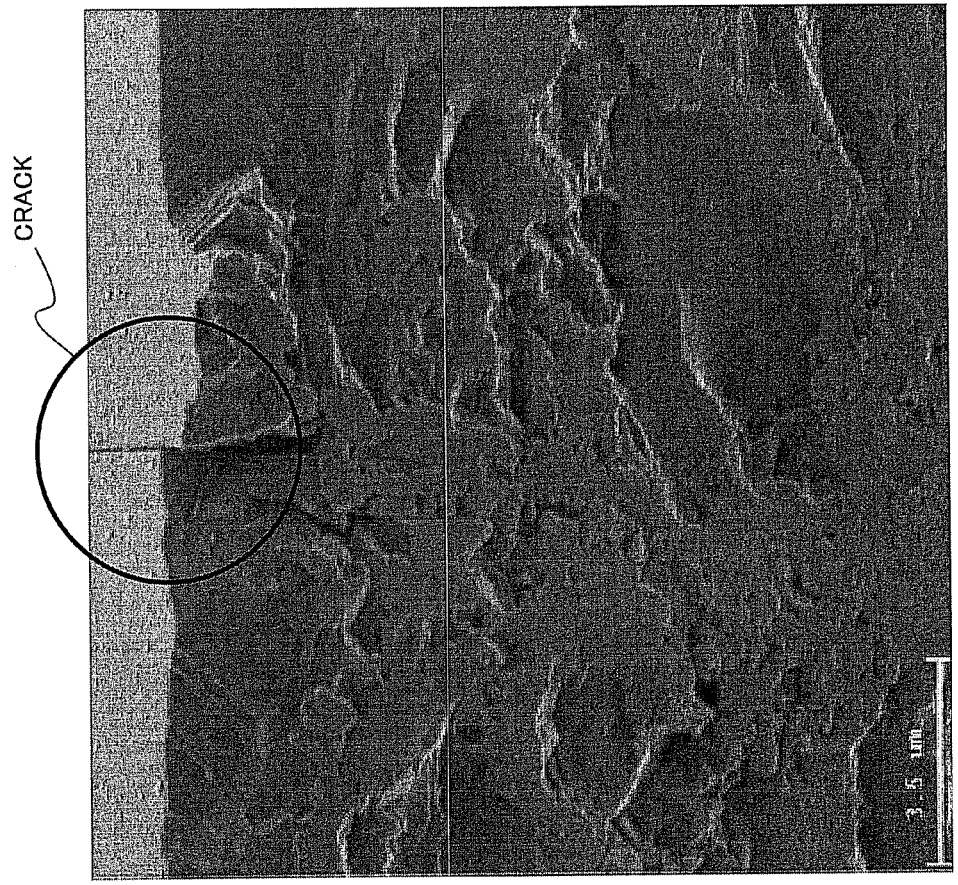
FIG. 20 is a cross-sectional SEM picture of a substrate which is vertical in a crack direction according to Example 1.

FIG. 19A illustrates a laser dicing result. An upper side is an optical picture of a substrate top surface, and a lower side is an optical picture of a substrate top surface of lower magnifying power than that of the upper side. The upper side optical picture is captured by adjusting the focus on an altered region inside the substrate. The lower side optical picture is captured by adjusting the focus on a crack on the substrate surface. Further, FIG. 20 is a cross-sectional SEM picture of a substrate which is vertical in a crack direction.

A work piece had a strip shape having about 5 mm of the width, and a pulse laser beam was vertically radiated in a strip stretching direction to form a crack. After the crack was formed, a cutting force required to perform cutting using a breaker was evaluated.

Example 2

Laser dicing was performed according to the same method as in Example 1 except for irradiation/non-irradiation=1/1.

FIG. 19B illustrates a laser dicing result. An upper side is an optical picture of a substrate top surface, and a lower side is an optical picture of a substrate top surface of lower magnifying power than that of the upper side.

Example 3

Laser dicing was performed according to the same method as in Example 1 except for irradiation/non-irradiation=2/2. FIG. 19C illustrates a laser dicing result. An upper side is an optical picture of a substrate top surface, and a lower side is an optical picture of a substrate top surface of lower magnifying power than that of the upper side.

Example 4

Laser dicing was performed according to the same method as in Example 1 except for irradiation/non-irradiation=2/3. FIG. 19E illustrates a laser dicing result. An upper side is an optical picture of a substrate top surface, and a lower side is an optical picture of a substrate top surface of lower magnifying power than that of the upper side.

Comparative Example 1

Laser dicing was performed according to the same method as in Example 1 except for irradiation/non-irradiation=1/3. FIG. 19D illustrates a laser dicing result. An upper side is an optical picture of a substrate top surface, and a lower side is an optical picture of a substrate top surface of lower magnifying power than that of the upper side.

In Examples 1 to 4, by setting irradiation energy of a pulse laser beam, a process point depth and an interval between irradiation and non-irradiation as described above, it was possible to form a crack which was continuous in a work piece surface as illustrated in FIGS. 19A to E and 20.

Particularly, under a condition in Example 1, a highly linear crack was formed in the work piece surface. Hence, a cut portion after cutting also had good linearity. Further, under the condition in Example 1, the substrate could be cut with the smallest cutting force. Consequently, when a work piece is a sapphire substrate, if controllability of each condition is taken into account, by setting the irradiation energy to 50±5 mW, the process point depth to 25.0±2.5 μm, passing of a pulse laser beam in one light pulse unit and blocking to 2 light pulse units, an interval of irradiation is preferably set to 3.6±0.4 μm.

Meanwhile, as in Example 3, when an altered region approached and a crack was formed inside a substrate between altered regions, the crack in the surface wobbled, and the width of the area in which the crack was formed tended to widen. This is because power of laser light which concentrates on a narrow area is too significant.

In Comparative Example 1, the condition was not optimized, and a crack which was continuous in a substrate surface was not formed. Consequently, the cutting force could not be evaluated.

Example 5

Laser dicing was performed under the following condition according to the method disclosed in the embodiment.
Work piece: Sapphire substrate, substrate thickness 100 μm
Laser light source: Nd:YVO$_4$ laser
Wavelength: 532 nm
Radiation energy: 90 mW
Laser frequency: 20 KHz
Radiation light pulse number (P1): 1
Non-irradiation light pulse number (P2): 1
Stage speed: 25 mm/sec FIG. 21A illustrates a laser dicing result. An upper side is an optical picture of a substrate top surface, and a lower side is an optical picture of a substrate top surface of lower magnifying power than that of the upper side. The upper side optical picture is captured by adjusting the focus on an altered region inside the substrate. The lower side optical picture is captured by adjusting the focus on a crack on the substrate surface.

Example 6

Laser dicing was performed according to the same method as in Example 5 except for irradiation/non-irradiation=1/2. FIG. 21B illustrates a laser dicing result. An upper side is an optical picture of a substrate top surface, and a lower side is an optical picture of a substrate top surface of lower magnifying power than that of the upper side.

Example 7

Laser dicing was performed according to the same method as in Example 5 except for irradiation/non-irradiation=2/2. FIG. 21C illustrates a laser dicing result. An upper side is an optical picture of a substrate top surface, and a lower side is an optical picture of a substrate top surface of lower magnifying power than that of the upper side.

Example 8

Laser dicing was performed according to the same method as in Example 5 except for irradiation/non-irradiation=1/3. FIG. 21D illustrates a laser dicing result. An upper side is an optical picture of a substrate top surface, and a lower side is an optical picture of a substrate top surface of lower magnifying power than that of the upper side.

Example 9

Laser dicing was performed according to the same method as in Example 5 except for irradiation/non-irradiation=2/3. FIG. 21E illustrates a laser dicing result. An upper side is an optical picture of a substrate top surface, and a lower side is an optical picture of a substrate top surface of lower magnifying power than that of the upper side.

Example 10

Laser dicing was performed according to the same method as in Example 5 except for irradiation/non-irradiation=3/3. FIG. 21F illustrates a laser dicing result. An upper side is an optical picture of a substrate top surface, and a lower side is an optical picture of a substrate top surface of lower magnifying power than that of the upper side.

In Examples 5 to 10, by setting irradiation energy of a pulse laser beam, a process point depth and an interval between irradiation and non-irradiation as described above, it was possible to form a crack which was continuous in a work piece surface as illustrated in FIGS. 21A to 21F.

Particularly, under a condition in Example 8, a comparatively linear crack was formed in the work piece surface. Further, under the condition in Example 8, the cutting force was also much lower. Naturally, compared to 50 mW of irradiation energy according to Examples 1 to 4, a crack in the surface wobbled, and the width of an area in which a crack was formed tended to widen. Hence, linearity of a cut portion in case of 50 mW was also better. This is because, in case of 90 mW, power of laser light which concentrates on a narrow area compared to 50 mW is too significant.

Example 11

Laser dicing was performed under the following condition according to the method disclosed in the embodiment.
Work piece: Sapphire substrate, substrate thickness 100 μm
Laser light source: Nd:YVO$_4$ laser
Wavelength: 532 nm
Radiation energy: 50 mW
Laser frequency: 20 KHz
Radiation light pulse number (P1): 1
Non-irradiation light pulse number (P2): 2
Stage speed: 25 mm/sec
Process point depth: About 15.2 μm from work piece surface Dicing process was performed under a condition that a process point depth was 10 μm shallower than that in Example 1, that is, under a condition that a light condensing position of a pulse laser beam was closer to a work piece surface than that in Example 1.

FIG. 22A illustrates a laser dicing result. A picture is captured by adjusting the focus on an altered region inside the substrate. In this picture, a right side line (+10 μm) is the condition of Example 11. For comparison, the condition of Example 1 (0) only the process point depth of which is different is illustrated on a left side.

Example 12

Laser dicing was performed according to the same method as in Example 11 except for irradiation/non-irradiation=1/1. FIG. 22B illustrates a laser dicing result.

Example 13

Laser dicing was performed according to the same method as in Example 11 except for irradiation/non-irradiation=2/2. FIG. 22C illustrates a laser dicing result.

Example 14

Laser dicing was performed according to the same method as in Example 11 except for irradiation/non-irradiation=1/3. FIG. 22D illustrates a laser dicing result.

Example 15

Laser dicing was performed according to the same method as in Example 11 except for irradiation/non-irradiation=2/3. FIG. 22E illustrates a laser dicing result.

In Examples 11 to 15, by setting irradiation energy of a pulse laser beam, a process point depth and an interval between irradiation and non-irradiation as described above, it was possible to form a crack which was continuous in a work piece surface as illustrated in FIGS. 22A to 22E.

Naturally, compared to Examples 1 to 4, a significant crack of an altered region was exposed in a surface. Naturally, the crack in the surface tended wobbled, and the width of an area in which a crack was formed tended to widen.

Example 16

Laser dicing was performed under the following condition according to the method disclosed in the embodiment.

Work piece: Sapphire substrate
Laser light source: Nd:YVO$_4$ laser
Wavelength: 532 nm
Radiation energy: 90 mW
Laser frequency: 20 KHz
Radiation light pulse number (P1): 1
Non-irradiation light pulse number (P2): 1
Stage speed: 25 mm/sec Dicing process was performed under a condition that a process point depth was 10 μm shallower than that in Example 5, that is, under a condition that a light condensing position of a pulse laser beam was closer to a work piece surface than that in Example 5.

FIG. 23A illustrates a laser dicing result. A picture is captured by adjusting the focus on an altered region inside the substrate. In this picture, a right side line (+10 μm) is the condition of Example 16. For comparison, the condition of Example 5 (0) only the process point depth of which is different is illustrated on a left side.

Example 17

Laser dicing was performed according to the same method as in Example 16 except for irradiation/non-irradiation=½. FIG. 23B illustrates a laser dicing result.

Example 18

Laser dicing was performed according to the same method as in Example 16 except for irradiation/non-irradiation=2/2. FIG. 23C illustrates a laser dicing result.

Example 19

Laser dicing was performed according to the same method as in Example 16 except for irradiation/non-irradiation=⅓. FIG. 23D illustrates a laser dicing result.

Example 20

Laser dicing was performed according to the same method as in Example 16 except for irradiation/non-irradiation=⅔. FIG. 23E illustrates a laser dicing result.

Example 21

Laser dicing was performed according to the same method as in Example 16 except for irradiation/non-irradiation=¼. FIG. 23F illustrates a laser dicing result.

In Examples 16 to 21, by setting irradiation energy of a pulse laser beam, a process point depth and an interval between irradiation and non-irradiation as described above, it was possible to form a crack which was continuous in a work piece surface as illustrated in FIG. 23.

Naturally, compared to Examples 5 to 10, a significant crack of an altered region was exposed in a surface. Naturally, the crack in the surface tended wobbled, and the width of an area in which a crack was formed tended to widen. Hence, the cut portion after cutting wobbled.

As described above, from the evaluations according to Examples 1 to 21 and Comparative Example 1, it became obvious that, when the thickness of the work piece was 100 μm, the linearity of the crack was also good, so that the condition of Example 1 that the cutting force was low was optimal.

Example 22

Laser dicing was performed under the following condition according to the method disclosed in the embodiment.

Work piece: Sapphire substrate, substrate thickness 150 μm
Laser light source: Nd:YVO$_4$ laser
Wavelength: 532 nm
Radiation energy: 200 mW
Laser frequency: 200 KHz
Radiation light pulse number (P1): 1
Non-irradiation light pulse number (P2): 2
Stage speed: 5 mm/sec
Process point depth: About 23.4 μm from work piece surface While a sapphire substrate has 100 μm of the work piece thickness in Examples 1 to 21, a sapphire substrate has 150 μm of the work piece thickness in this Example. FIG. 24A illustrates a laser dicing result. An upper side is an optical picture of a cut surface of a substrate, and a lower side is a schematic view of an irradiation pattern in a substrate cross section. ON (colored) refers to irradiation areas, and OFF (white) refers to non-irradiation areas.

A work piece had a strip shape having about 5 mm of the width, and a pulse laser beam was vertically radiated in a strip stretching direction to form a crack. After the crack was formed, a cutting force required to perform cutting using a breaker was evaluated.

Example 23

Laser dicing was performed according to the same method as in Example 22 except for irradiation/non-irradiation=2/4. FIG. 24B illustrates a laser dicing result.

Example 24

Laser dicing was performed according to the same method as in Example 22 except for irradiation/non-irradiation=3/5. FIG. 24C illustrates a laser dicing result.

The linearity of the crack was the same degree in Examples 22 and 23, and the linearity of a cut portion after cutting was also the same degree. Further, the cutting force required for cutting was 2.39 N to 2.51 N in Example 22, was 2.13 N to 2.80 N in Example 23 and was 1.09 N to 1.51 N in Example 24. As a result, it was found that the cutting force required for cutting was the lowest under a condition of Example 24 upon irradiation/non-irradiation=3/5. Consequently, when the thickness of the work piece was 150 μm, it became obvious that the condition of Example 24 was optimal.

As described above in Examples, it became obvious that, even when the thickness of the work piece changed, by controlling, for example, irradiation energy of a pulse laser beam and a process point depth of a pulse laser beam, and, in addition, irradiation and non-irradiation of a pulse laser beam in synchronization with the same process control clock signal with which the pulse laser beam synchronized, and switching irradiation and non-irradiation in light pulse units, it is possible to realize optimal cutting performance.

In addition, although a case has been described with Examples where work pieces are 100 μm and 150 μm, thicker work pieces of 200 μm and 250 μm can also realize optimal cutting performance.

Example 25

Laser dicing was performed under the following condition according to the method disclosed in the embodiment.
Work piece: Quartz substrate, substrate thickness 100 μm
Laser light source: Nd:YVO$_4$ laser
Wavelength: 532 nm
Radiation energy: 250 mW
Laser frequency: 100 KHz
Radiation light pulse number (P1): 3
Non-irradiation light pulse number (P2): 3
Stage speed: 5 mm/sec
Process point depth: About 10 μm from work piece surface A work piece had a strip shape having about 5 mm of the width, and a pulse laser beam was vertically radiated in a strip stretching direction to form a crack. After the crack was formed, cutting was performed using a breaker.

FIG. 25 illustrates a laser dicing result. FIG. 25A is an optical picture of a substrate top surface, and FIG. 25B is an optical picture of a substrate cross section. Even when a work piece is a quartz substrate as illustrated in FIGS. 25A and 25B, an improved layer was formed inside, and a crack which was continuous in a work piece surface could be formed. Consequently, linear cutting could be performed using a breaker.

Example 26

Laser dicing was performed under the following condition according to the method disclosed in the embodiment.
Work piece: Quartz glass substrate, substrate thickness 500 μm
Laser light source: Nd:YVO$_4$ laser
Wavelength: 532 nm
Radiation energy: 150 mW
Laser frequency: 100 KHz
Radiation light pulse number (P1): 3
Non-irradiation light pulse number (P2): 3
Stage speed: 5 mm/sec
Process point depth: About 12 μm from work piece surface A work piece had a strip shape having about 5 mm of the width, and a pulse laser beam was vertically radiated in a strip stretching direction to form a crack. After the crack was formed, cutting was performed using a breaker.

Figure 26:
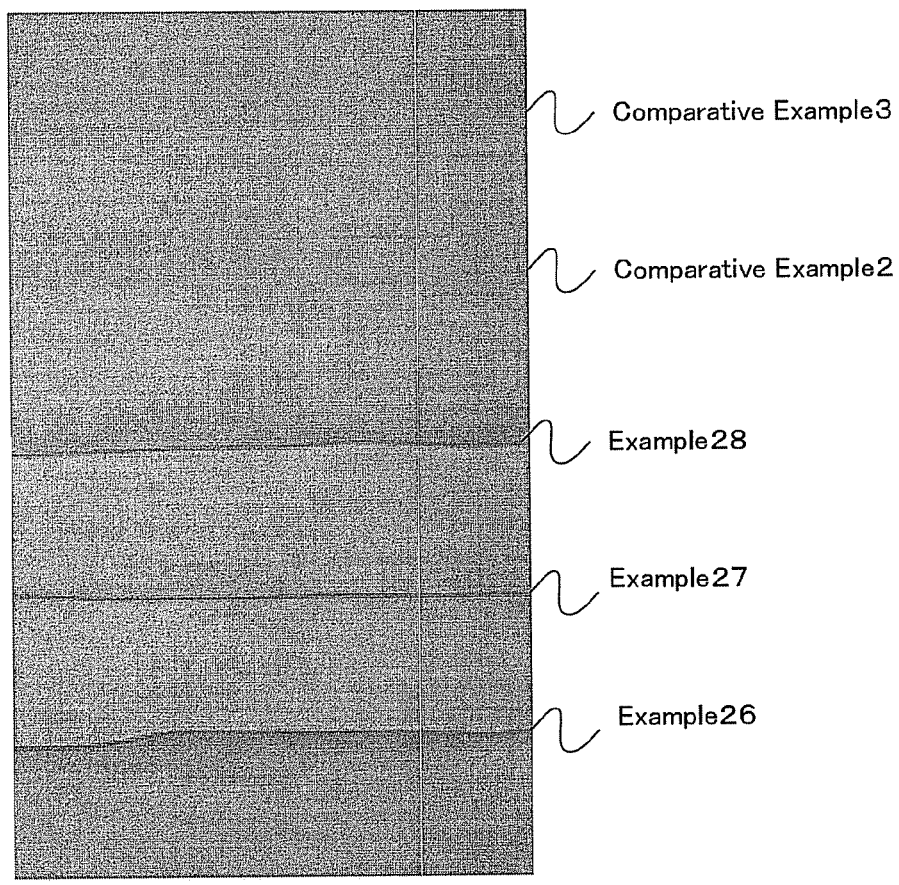
FIG. 26 is a view illustrating laser dicing results according to Examples 26 to 28 and Comparative Examples 2 and 3.

FIG. 26 illustrates a laser dicing result. FIG. 26 is an optical picture of a substrate top surface.

Example 27

Laser dicing was performed according to the same method as in Example 26 except that a process point depth was about 14 μm from a work piece surface. FIG. 26 illustrates a laser dicing result.

Example 28

Laser dicing was performed according to the same method as in Example 26 except that a process point depth was about 16 μm from a work piece surface. FIG. 26 illustrates a laser dicing result.

Comparative Example 2

Laser dicing was performed according to the same method as in Example 26 except that a process point depth was about 18 μm from a work piece surface. FIG. 26 illustrates a laser dicing result.

Comparative Example 3

Laser dicing was performed according to the same method as in Example 26 except that a process point depth was about 20 μm from a work piece surface. FIG. 26 illustrates a laser dicing result.

Even when a work piece was a quartz glass substrate as illustrated in FIG. 26, a crack which was continuous in a work piece surface could be formed under conditions of Examples 26 to 28. Consequently, linear cutting could be performed using a breaker. Particularly, in Example 27, it was possible to form a crack of the highest linearity and perform cutting of high linearity. In Comparative Examples 2 and 3, the conditions were not optimized, and a crack which was continuous in a substrate surface was not formed.

As described above in Examples 25 to 28, it became obvious that, even when the work piece changed from a sapphire substrate to a quartz substrate or a quartz glass substrate, by controlling, for example, irradiation energy of a pulse laser beam and a process point depth of a pulse laser beam, and, in addition, irradiation and non-irradiation of a pulse laser beam in synchronization with the same process control clock signal with which the pulse laser beam synchronized, and switching irradiation and non-irradiation in light pulse units, it is possible to realize optimal cutting performance.

What is claimed is:

1. A laser dicing method of a work piece on a surface of which a metal film is provided, the laser dicing method comprising:
    setting the work piece on a stage;
    a first metal film removing of irradiating a pulse laser beam defocused from the metal film, along a first line, and removing the metal film;
    a second metal film removing of irradiating the pulse laser beam defocused from the metal film, along a second line orthogonal to the first line, and removing the metal film;
    and a crack forming of irradiating the pulse laser beam in an area from which the metal film of the work piece is removed, and forming the crack in the work piece,
    wherein, in an area in which the first line and the second line cross, irradiation of the pulse laser beam is interrupted in one of the first metal film removing and the second metal film removing; and
    wherein, in the first or second metal film removing, an irradiation control signal which comprises information of an interruption portion of irradiation of the pulse laser beam is generated, and irradiation of the pulse laser beam in an area in which the first line and the second line cross is interrupted using the irradiation control signal.

2. The laser dicing method according to claim 1, wherein the work piece is a substrate on which a LED is formed.

3. The laser dicing method according to claim 1, wherein:
    in the first and second metal film removing,
    a clock signal is generated,
    the pulse laser beam synchronized with the clock signal is emitted,
    the work piece and the pulse laser beam are relatively moved,
    irradiation and non-irradiation of the pulse laser beam on the work piece are switched in light pulse units by controlling passing and blocking of the pulse laser beam using a pulse picker in synchronization with the clock signal,
    and the metal film is removed;
    and in the crack forming,
    the work piece is set on a stage,
    the clock signal is generated,
    the pulse laser beam synchronized with the clock signal is emitted,
    the work piece and the pulse laser beam are relatively moved, irradiation and non-irradiation of the pulse laser beam on the work piece are switched in light pulse units by controlling passing and blocking of the pulse laser beam using a pulse picker in synchronization with the clock signal,
    and a crack reaching a substrate surface of the work piece is formed to be continuous in the substrate surface of the work piece by controlling an irradiation energy of the pulse laser beam, a process point depth of the pulse laser beam and lengths of an irradiation area and a non-irradiation area of the pulse laser beam.

4. The laser dicing method according to claim 1, wherein the crack is formed substantially linearly in the substrate surface of the work piece.

5. The laser dicing method according to claim 1, wherein a position of the work piece and an operation start position of the pulse picker are synchronized.

6. The laser dicing method according to claim 1, wherein the work piece includes a sapphire substrate, a quartz substrate or a glass substrate.

7. The laser dicing method according to claim 1, wherein the first and second metal removing and the crack forming are continuously executed by an identical laser dicing device in a state in which the work piece is set on an identical stage.

8. The laser dicing method according to claim 1, wherein a focus position of the pulse laser beam is defocused to an outside of the work piece.

9. The laser dicing method according to claim 1, wherein, in the first metal film removing and the second metal film removing, a plurality of parallel pulse laser beams is radiated.

10. The laser dicing method according to claim 1, wherein the metal film is copper or gold.

* * * * *